US009723761B2

(12) United States Patent
Rogers

(10) Patent No.: US 9,723,761 B2
(45) Date of Patent: Aug. 1, 2017

(54) DATA CENTRE

(71) Applicant: BRIPCO BVBA, Antwerp (BE)

(72) Inventor: Paul Rogers, Cheltenham (GB)

(73) Assignee: BRIPCO BVBA, Antwerp (BE)

( * ) Notice: Subject to any disclaimer, the term of this patent is extended or adjusted under 35 U.S.C. 154(b) by 104 days.

(21) Appl. No.: 14/728,806

(22) Filed: Jun. 2, 2015

(65) Prior Publication Data

US 2015/0382512 A1 Dec. 31, 2015

Related U.S. Application Data

(63) Continuation of application No. 13/942,308, filed on Aug. 15, 2013, now Pat. No. 9,069,534, which is a
(Continued)

(30) Foreign Application Priority Data

Jun. 3, 2009 (GB) .................................. 0909584.5

(51) Int. Cl.
*H05K 7/20* (2006.01)
*F25D 23/12* (2006.01)
(Continued)

(52) U.S. Cl.
CPC ........... *H05K 7/20745* (2013.01); *E04H 5/02* (2013.01); *F24F 7/04* (2013.01); *F25D 23/12* (2013.01);
(Continued)

(58) Field of Classification Search
CPC ........... H05K 7/20745; H05K 7/20145; H05K 7/20181; H05K 7/20136; H05K 7/20554; H05K 7/20; E06B 7/08; F25D 23/12
(Continued)

(56) References Cited

U.S. PATENT DOCUMENTS 145,481 A 12/1873 Beach et al.
1,677,910 A 7/1928 Wills et al.
(Continued)

FOREIGN PATENT DOCUMENTS

CA 2676213 A1 2/2010
CN 2739330 Y 11/2005
(Continued)

OTHER PUBLICATIONS

International Search Report and Written Opinion dated Mar. 28, 2012 in related International Application No. PCT/GB2011/050987.
(Continued)

*Primary Examiner* — Joshua J Michener
*Assistant Examiner* — Matthew Gitlin
(74) *Attorney, Agent, or Firm* — Carlos A. Fisher; Stout, Uxa & Buyan

(57) ABSTRACT

A data center (100) includes at least one rack room (in for example module 140) having a floor and a plurality of rack storage areas on the floor, each rack storage area being arranged to accommodate a plurality of racks (143) in which a plurality of rack-mountable electronic components may be housed, one or more controllable air circulation systems (in for example module 122), one or more cold aisles (144) in the rack room, each cold aisle being adjacent to a rack storage area, and one or more hot aisles (145) in the rack room, each hot aisle being adjacent to a rack storage area. There may be a large air duct, in the form of a personnel corridor (123), for transporting, under the control of the one or more air circulation systems, cooling air, above the floor, to the one or more cold aisles. The air supply corridor/duct (123) may have a height greater than 1.5 m above the floor and a cross-sectional area of at least 2 m² and a maximum dimension in the plane of the cross-section of less than 3 m.

19 Claims, 21 Drawing Sheets

Related U.S. Application Data continuation of application No. 12/851,771, filed on Aug. 6, 2010, now Pat. No. 8,514,572, which is a continuation-in-part of application No. PCT/GB2009/051777, filed on Dec. 29, 2009, and a continuation of application No. PCT/GB2010/000759, filed on Apr. 15, 2010.

(51) Int. Cl.

| | | |
|---|---|---|
| F24F 7/04 | (2006.01) | |
| G06F 1/20 | (2006.01) | |
| E04H 5/02 | (2006.01) | |
| H05K 7/14 | (2006.01) | |
| E04H 5/00 | (2006.01) | |

(52) U.S. Cl.
CPC ............. *G06F 1/20* (2013.01); *H05K 7/1497* (2013.01); *H05K 7/20136* (2013.01); *H05K 7/20145* (2013.01); *H05K 7/20181* (2013.01); *H05K 7/20554* (2013.01); *H05K 7/20754* (2013.01); *E04H 2005/005* (2013.01); *H05K 7/20* (2013.01)

(58) Field of Classification Search
USPC ..... 454/184, 195, 239, 330, 331, 332, 3, 58, 454/908, 257; 49/38, 39, 139; 52/173.1; 361/695, 694; 236/49.3, 49.5, 49.4; 160/97
See application file for complete search history.

(56) References Cited

U.S. PATENT DOCUMENTS

| | | | |
|---|---|---|---|
| 1,939,312 A | 12/1933 | Murray | |
| 2,308,262 A | 1/1943 | Beil | |
| 2,928,330 A | 3/1960 | Brandi | |
| 4,380,910 A | 4/1983 | Hood et al. | |
| 4,432,272 A | 2/1984 | Vans Becelaere | |
| 4,478,767 A | 10/1984 | Watanabe et al. | |
| 4,494,596 A | 1/1985 | Bradshaw | |
| 4,765,231 A | 8/1988 | Aniello | |
| 4,765,397 A | 8/1988 | Chrysler et al. | |
| 5,197,293 A | 3/1993 | Okamura et al. | |
| 5,240,177 A | 8/1993 | Muramatsu et al. | |
| 5,348,078 A | 9/1994 | Dushane et al. | |
| 5,449,319 A | 9/1995 | Dushane et al. | |
| 5,538,471 A | 7/1996 | Guiles, Jr. | |
| 5,545,086 A | 8/1996 | Sharp et al. | |
| 5,671,805 A * | 9/1997 | Ståhl | H05K 7/2059 165/104.33 |
| 5,957,772 A | 9/1999 | Rutkowski et al. | |
| 6,089,464 A | 7/2000 | Morgan | |
| 6,283,380 B1 | 9/2001 | Nakanishi et al. | |
| 6,374,627 B1 * | 4/2002 | Schumacher | G06F 1/20 165/104.33 |
| 6,467,694 B1 | 10/2002 | Jerome | |
| 6,672,955 B2 * | 1/2004 | Charron | F24F 3/0442 361/691 |
| 6,681,584 B1 | 1/2004 | Conner | |
| 6,694,759 B1 | 2/2004 | Bash et al. | |
| 6,775,997 B2 | 8/2004 | Bash et al. | |
| 6,822,859 B2 | 11/2004 | Coglitore et al. | |
| 6,826,922 B2 | 12/2004 | Patel et al. | |
| 6,854,284 B2 | 2/2005 | Bash et al. | |
| 6,867,967 B2 * | 3/2005 | Mok | G06F 1/16 236/49.3 |
| 6,896,612 B1 | 5/2005 | Novotny | |
| 6,980,433 B2 * | 12/2005 | Fink | E04H 5/02 165/121 |
| 7,278,273 B1 | 10/2007 | Whitted et al. | |
| 7,315,448 B1 | 1/2008 | Bash et al. | |
| 7,330,350 B2 | 2/2008 | Hellriegel et al. | |
| 7,430,118 B1 | 9/2008 | Noteboom et al. | |
| 7,558,649 B1 | 7/2009 | Sharma et al. | |
| 7,707,880 B2 | 5/2010 | Campbell et al. | |
| 7,716,939 B1 | 5/2010 | Morales | |
| 7,724,513 B2 | 5/2010 | Coglitore et al. | |
| 7,867,070 B2 * | 1/2011 | Day | H05K 7/20745 454/184 |
| 7,903,407 B2 * | 3/2011 | Matsushima | H05K 7/20745 361/690 |
| 7,990,709 B2 | 8/2011 | Campbell et al. | |
| 8,020,777 B2 | 9/2011 | Kates | |
| 8,054,625 B2 | 11/2011 | Noteboom et al. | |
| 8,313,038 B2 | 11/2012 | Therrein et al. | |
| 8,514,572 B2 * | 8/2013 | Rogers | H05K 7/20745 165/287 |
| 8,523,643 B1 * | 9/2013 | Roy | G06F 1/20 454/184 |
| 8,534,119 B2 * | 9/2013 | Bean, Jr. | H05K 7/20745 73/40.5 R |
| 8,555,591 B2 | 10/2013 | Yeh et al. | |
| 2001/0035462 A1 | 11/2001 | Collazo | |
| 2002/0108386 A1 | 8/2002 | Spinazzola et al. | |
| 2002/0164944 A1 | 11/2002 | Haglid | |
| 2003/0050003 A1 | 3/2003 | Charron | |
| 2003/0067745 A1 | 4/2003 | Patel et al. | |
| 2004/0068994 A1 | 4/2004 | Yoon et al. | |
| 2004/0149832 A1 | 8/2004 | Peterson | |
| 2004/0184232 A1 | 9/2004 | Fink | |
| 2004/0244310 A1 | 12/2004 | Blumberg | |
| 2005/0099770 A1 | 5/2005 | Fink | |
| 2005/0235671 A1 | 10/2005 | Belady et al. | |
| 2005/0237716 A1 | 10/2005 | Chu et al. | |
| 2005/0274463 A1 | 12/2005 | Becker | |
| 2005/0284402 A1 | 12/2005 | Becker | |
| 2006/0082263 A1 | 4/2006 | Rimler et al. | |
| 2006/0091229 A1 | 5/2006 | Bash et al. | |
| 2006/0260338 A1 * | 11/2006 | VanGilder | H05K 7/20745 62/259.2 |
| 2007/0069850 A1 | 3/2007 | Anderson, Jr. et al. | |
| 2007/0078635 A1 | 4/2007 | Rasmussen et al. | |
| 2007/0135032 A1 | 6/2007 | Wang | |
| 2007/0190919 A1 | 8/2007 | Donovan et al. | |
| 2007/0251175 A1 | 11/2007 | Wexler | |
| 2007/0274035 A1 | 11/2007 | Fink et al. | |
| 2007/0277458 A1 | 12/2007 | Graboyes | |
| 2008/0000630 A1 | 1/2008 | Haglid | |
| 2008/0029250 A1 | 2/2008 | Carlson et al. | |
| 2008/0055848 A1 | 3/2008 | Hamburgen et al. | |
| 2008/0094797 A1 | 4/2008 | Coglitore et al. | |
| 2008/0174954 A1 | 7/2008 | VanGilder et al. | |
| 2008/0185446 A1 | 8/2008 | Tozer | |
| 2008/0236070 A1 | 10/2008 | Serinet | |
| 2008/0261626 A1 | 10/2008 | Farazmandnia | |
| 2008/0291626 A1 * | 11/2008 | Nelson | F24F 1/0059 361/696 |
| 2008/0305733 A1 * | 12/2008 | Noteboom | H05K 7/20745 454/184 |
| 2009/0038325 A1 | 2/2009 | Yagi et al. | |
| 2009/0050591 A1 | 2/2009 | Hart et al. | |
| 2009/0088873 A1 | 4/2009 | Avery et al. | |
| 2009/0160129 A1 | 6/2009 | Thinnes et al. | |
| 2009/0210096 A1 | 8/2009 | Stack et al. | |
| 2009/0229194 A1 | 9/2009 | Armillas | |
| 2009/0241454 A1 | 10/2009 | Yeh et al. | |
| 2009/0302124 A1 | 12/2009 | Dawson et al. | |
| 2009/0326721 A1 | 12/2009 | Sugiyama et al. | |
| 2010/0012737 A1 | 1/2010 | Kates | |
| 2010/0027216 A1 | 2/2010 | Matsushima et al. | |
| 2010/0048119 A1 | 2/2010 | Tashiro | |
| 2010/0110626 A1 | 5/2010 | Schmitt et al. | |
| 2010/0154448 A1 | 6/2010 | Hay | |
| 2010/0188816 A1 | 7/2010 | Bean, Jr. et al. | |
| 2010/0223085 A1 | 9/2010 | Gauthier et al. | |
| 2010/0290197 A1 | 11/2010 | Bergthold et al. | |
| 2010/0307716 A1 | 12/2010 | Bean, Jr. et al. | |
| 2011/0097987 A1 | 4/2011 | Wang Chen | |

(56) References Cited

U.S. PATENT DOCUMENTS

| | | | |
|---|---|---|---|
| 2011/0306288 A1 | 12/2011 | Murayama et al. | |
| 2013/0062047 A1* | 3/2013 | Vaney | H05K 7/20836 165/287 |

FOREIGN PATENT DOCUMENTS

| | | |
|---|---|---|
| DE | 2635445 A1 | 2/1978 |
| DE | 3624541 A1 | 1/1988 |
| DE | 20220834 U1 | 4/2004 |
| DE | 102008002789 A1 | 9/2009 |
| EP | 1488305 B1 | 10/2008 |
| GB | 2410546 A | 8/2005 |
| GB | 2423573 A | 8/2006 |
| GB | 2446454 A | 8/2008 |
| GB | 2450098 A | 12/2008 |
| GB | 2450231 A | 12/2008 |
| GB | 2464284 A | 4/2010 |
| GB | 2466178 A | 6/2010 |
| GB | 2467808 A | 8/2010 |
| GB | 2480401 A | 11/2011 |
| JP | 2009109045 A | 5/2009 |
| WO | WO 97/35154 A1 | 9/1997 |
| WO | 02052107 A2 | 7/2002 |
| WO | 03083631 A1 | 10/2003 |
| WO | WO 2006/111789 A1 | 10/2006 |
| WO | 2006124420 A2 | 11/2006 |
| WO | WO 2007/055838 A2 | 5/2007 |
| WO | 2007082351 A1 | 7/2007 |
| WO | 2007139559 A1 | 12/2007 |
| WO | 2007139560 A1 | 12/2007 |
| WO | WO 2008/030094 A2 | 3/2008 |
| WO | 2008039773 A2 | 4/2008 |
| WO | 2008127344 A1 | 10/2008 |
| WO | WO 2010/017429 A1 | 2/2010 |
| WO | 2010039120 A1 | 4/2010 |
| WO | 2010056473 A2 | 5/2010 |
| WO | WO 2010/054786 A1 | 5/2010 |
| WO | WO 2010/075358 A1 | 7/2010 |
| WO | WO 2010/131954 A1 | 11/2010 |
| WO | WO 2011/066311 A1 | 6/2011 |

OTHER PUBLICATIONS

"Optimizing facility operation in high density data center environments", Technology brief, Copyright 2007 Hewlett-Packard Development Company, L.P., 25 pages.

Neil Rasmussen, "Air Distribution Architecture Options for Mission Critical Facilities", Copyright 2003 American Power Conversion, 13 pages, White Paper # 55.

Partial International Report mailed on Nov. 2, 2011 in related PCT Application Serial No. PCT/GB2011/050987.

Robert Tozer, "Developing a viable date center energy strategy" Data Center Dynamics, Dec. 5, 2008.

Tshudi et al., "Measuring and Managing Data-Center Energy Use", HPAC Engineering, Mar. 2, 2006.

"High-performance Data Centers", Pacific Gas and Electric Company, Jan. 2006.

Hernandez et al. "Analysis of Hybrid Cooling System at an Act2 Pilot Demonstration Site", ACEEE Summer Study on Energy Efficiency in Building Proceedings (1996).

Robert Tozer, "Data Centre Energy Saving Air Management Metrics", Datacenter Dynamics, Dec. 19, 2006.

PCT International Preliminary Report on Patentability dated Jun. 29, 2011 and Written Opinion dated Apr. 13, 2010 International Application No. PCT/US2009/069154.

USPTO office action dated Aug. 17, 2011 in U.S. Appl. No. 12/341,137, filed Dec. 22, 2008.

UK Intellectual Property Office communication dated Sep. 1, 2010 in related UK Application No. GB 1008825.0.

German to English Translation of DE2635445.

PCT Invitation to Pay Additional Feed and Communication Relating to the Results of the Partial International Search in PCT Application No. PCT/gb2009/051777 dated Apr. 19, 2010.

PCT International Search Report and Written Opinion dated Jul. 28, 2010 in PCT Application No. PCT/GB2009/051777.

PCT Invitation to Pay Additional Fees and Communication Relating to the Results of the Partial International Search in PCT Application No. PCT Application No. PCT/GB2010/000759 dated Jul. 29, 2010.

Corrected Search Report in GB0909584.5 dated Jul. 21, 2009, Claims 1&16 searched.

Further Search Report in GB0909584.5 dated Aug. 27, 2009, Claim 10 searched.

Further Search Report in GB0909584.5 dated Aug. 28, 2009, Claims 6-9 searched.

Further Search Report in GB0909584.5 dated Aug. 28, 2009, Claims 11&12 searched.

Further Search Report in GB0909584.5 dated Aug. 28, 2009, Claims 13-15 searched.

Further Search Report in GB0909584.5 dated Aug. 28, 2009, Claim 17 searched.

Further Search Report in GB0909584.5 dated Aug. 28, 2009, Claims 18 & 20 searched.

"Good Advice for Saving Electricity in the Server Room" Danish Energy Saving Trust, published Nov. 2004, (http://www.savingtrust.dk/publications/guidelines/good-advice-for-saving-electricity-in-the-server-room).

"Mike Manos Microsoft's data center shipping magnate", Dec. 1, 2008, (http://www.datacentredynamics.com/ME2/dirmod.asp?sid=&nm=&type=Publishing&mod=Publications%3A%3AArticle&mid=8F3A7027421841978F18BE895F87F791&tier=4&id=79DA4D44477146D489629AA724C8A763).

Our Vision for Generation 4 Modular Data Centers—One way of getting it just right Dec. 2, 2008 by mmanos (http://loosebolts.wordpress.com/2008/12/02/our-vision-for-generation-4-modular-data-centers-one-way-of-getting-it-just-right/).

"High Performance Data Centers: A Design Guidelines Sourcebook" Jan. 2006, Pacific Gas and Electric Company (http://hightech.lbl.gov/documents/DATA_CENTERS/06_DataCenters-PGE.pdf).

"Fresh Air Cooling in Data Centres" Willman, Feb. 2007, © Future-Tech SCI Limited 2007, (http://www.datacenterdynamics.com/ME2/dirmod.asp?sid=&type=contact&mod=Contact%20Form&cfid=5153C6313ADC42E493ABCA07173413CA).

"Best Practices for Data Centers: Lessons Learned from Benchmarking 22 Data Centers", Greenberg et al. © 2006 ACEEE Summer Study on Energy Efficiency In Buildings(http://evanmills.lbl.gov/pubs/pdf/aceee-datacenters.pdf).

"Microsoft's next generation data center to include pre assembled component based containers"(Mar. 3, 2010), (http://www.datacenterdynamics.com/ME2/dirmod.asp?sid=AC7851064978479081E1821DB624320D&nm=DCD+RSS+News&type=news&mod=News&mid=9A02E3B96F2A415ABC72CB5F516B4C10&tier=3&nid=207C003C938242C28 B8F224E993C42A2).

"Microsoft envisions ultra-modular data centers" by Joab Jackson, Mar. 2, 2010, (http://www.computerworld.com/s/article/9166019/Microsoft_envisions_ultra_modular_data_centers).

"Microsoft 'All In' on Container-Powered Cloud", Mar. 4, 2010: Rich Miller (http://www.datacenterknowledge.com/archives/2010/03/04/microsoft-all-in-on-container-powered-cloud/).

"SGI tries adiabatic cooling to make a data center container greener", May 27, 2010 by Y. Sverdlik, (http://www.datacenterdynamicsfocus.com/ME2/dirmod.asp?sid=4015BD1DA6DE4E5A9CFBFE0FD8A9D12C&nm=Magazine+Archives&type=Publishing&mod=Publications%3A%BAArticle&mid=8F3A7027421841978F18BE895F87F791&tier=4&id=AA64DB0592CF4B479D7D574C4645DC74).

"Inside HP's 'Green' North Sea Data Center", Feb. 17, 2010, Rich Miller, (http://www.datacenterknowledge.com/inside-hps-green-north-sea-data-center/).

(56) References Cited

OTHER PUBLICATIONS

"Eco-Friendly Data Centre Promises Windfall for HP Clients", Greene Data Centre, Feb. 2, 2009, (http://h10134.www1.hp.com/news/features/5138/).
"HP Flexible Data Center Reduces Clients' Upfront Capital Investment Requirements by Half, Optimizes Resource Use" Jul. 27, 2010, (http://www.hp.com/hpinfo/newsroom/press/2010/100727a.html).
"HP's Cookie Cutter Data Center: Flexible DC" Jul. 27, 2010, (http://www.networkcomputing.com/data-center/hp-cookie-cutter-data-center-flexible-dc.php).
USPTO Office Action dated Mar. 26, 2014 in related U.S. Appl. No. 13/942,308, filed Aug. 15, 2013.
USPTO Office Action dated Oct. 7, 2014 in related U.S. Appl. No. 13/942,308, filed Aug. 15, 2013.
Office Action dated May 27, 2015 in related U.S. Appl. No. 13/942,308, filed Aug. 15, 2013.
Office Action dated Dec. 13, 2013 in related U.S. Appl. No. 13/942,308, filed Aug. 15, 2013.

\* cited by examiner

DATA CENTRE

CROSS-REFERENCE TO RELATED APPLICATIONS

The present application is a continuation of U.S. patent application Ser. No. 13/942,308, filed Aug. 13, 2013, which was a continuation of U.S. patent application Ser. No. 12/851,771, filed Aug. 6, 2010, which claims the benefit of Application PCT/GB2010/000759, filed Apr. 15, 2010, claims the benefit of International Application PCT/GB2009/051777, filed Dec. 29, 2009 and claims priority to United Kingdom Application GB0909584.5, filed Jun. 3, 2009; each of these applications being individually incorporated in its entirety herein by reference.

BACKGROUND OF THE INVENTION

The present invention concerns data centres, a method of cooling equipment in a data centre and also subject matter ancillary thereto. More particularly, but not exclusively, this invention concerns data centre buildings, for example provided in modular form. The invention also concerns a data centre building, a method of cooling electronic equipment in a data centre building, a method of constructing a data centre building, a method of extending an existing modular data centre building, a rack room building module for building a data centre, and a door arrangement for use within a building, for example a data centre. The invention also concerns a method of constructing a data centre in a space within a building.

A data centre is a late $20^{th}$ Century development that has grown as a response to the increasing demand for computer processing capability and a recognition of the importance of IT in the place of every business and organisation today. Whereas smaller organisations have sufficient processing power with laptops, PCs and occasionally servers, larger organisations require higher capacity centralised processing to serve a wide range of needs and applications. A few years ago this capacity was supplied by large mainframe computers, but more recently the method used has been to provide data centres comprising many networked computer servers known as "blades" installed in racks enabling controlled and modular expansion of capacity. The racks also typically house telecommunications equipment such as routers to handle data flow between the computer servers and data flow between the data centre and the outside world.

Data centres can mirror the growth and business activities of successful companies. The growth of a data centre within in an expanding company may typically work as follows:

1. Initially the data centre may start as single rack of servers in an air conditioned room—sometimes referred to as a 'data closet'.
2. As the organisation expands and along with it the number of IT racks employed, the closets become 'Server Rooms' or 'IT Rooms'.
3. Eventually the number of racks and size of room expands, often to the point where a dedicated building or part of a building houses the IT. Whilst there is no strict definition of when the size of an IT facility becomes large, or sophisticated, enough to be termed a "data centre", data centres are typically relatively large IT facilities providing robust and resilient IT facilities. Typically, there will be more than 50 servers (often many more) and at least some redundancy in the power supply powering the servers to ensure continuity of service.
4. As the company grows and/or becomes a multi-national organisation additional data centres will be built and sometimes numbers of these will be consolidated into 'Super Data Centres'.

Data centre facilities can require a floor space ranging from a few hundred square feet to a million square feet. The most prevalent size for a small data centre is five to ten thousand square feet with fifty to a hundred thousand square feet being the most common floor area requirement for a large data centre.

Data centres will typically have the ability to deliver applications spread across an organisation and/or supply chain and/or customers in differing geographical locations. There will typically be a dedicated mechanical and electrical (M&E) plant to deliver power, cooling and fire suppression with built-in redundancy with the aim of providing near continuous operation. The M&E plant may be located separately from the IT equipment to enable appropriately qualified engineers to work on either the M&E plant or the IT equipment independently of the other (thus improving security).

The IT industry has long recognised the criticality of central computing facilities and the need for energy efficient operations to control cost effectiveness. Current data centre technology is the summation of 30 years of innovation and engineering design thought and has come a long way in recent times. One key problem faced is how to cool a data centre effectively and efficiently. As explained above, a data centre can grow over time according to demand. As a result the following can happen:

1. A building is created, or a room within a building is allocated to IT. An electrical sub-system of conditioned ('Clean') power is run out to the IT room and the building's air conditioning system is adjusted to cool that room.
2. As the data room grows in scale, IT racks are laid out in rows. More IT products lead to more heat produced and so increased ventilation and air conditioning is required. Typically CRAC (Computer Room Air Conditioning) units are added to the end of the rows to provide the cooling. Air produced by these units is entrained through a raised floor and exits through floor grilles at the front of the IT rack rows. The IT products installed in the racks contain integral fans which draw the cooled air from the front across the circuitry and heat is exhausted via vents in the products to the rear. The separation created by these IT racks creates a 'hot aisle' into which air is expelled by the IT products in the racks and a 'cold aisle' from which cooler air is drawn into and through the IT products by their integral fans.
3. Dedicated M&E plant may be required. The M&E plant is sized based on an assessment of the future business requirements (over the next decade for example). Direct expansion (DX) or chilled water cooling plant is used to chill the air distributed within the data centre. Typically a 'set-point' is created to maintain the room at 21 Celsius, allowing for IT heat output and/or external ambient conditions.

The way in which cooling is effected in purpose built data centres often results in a similar arrangement. Thus, the equipment in the data centre is prevented from over-heating by means of introducing cool air into the room. A typical arrangement of the prior art is shown schematically in FIG. 1 of the attached drawings. Thus, the data centre includes a rack room 1 defined by walls 2 in which two sets of racks 4 for IT equipment are accommodated. The IT equipment in the racks 4 generate heat, represented by dark arrows 6. The cooling of the IT equipment is achieved by introducing cold air into the room by means of air conditioning units, the cold air being represented by light arrows 8.

The drive for more efficient use of power has given rise to a need to make the cooling used in data centres more efficient, as cooling of equipment typically contributes significantly to the power used by a data centre. The efficiency of a data centre may be measured by means of a quantity known as the Power Usage Effectiveness (PUE), which is the ratio of the total energy used by a data centre, including IT equipment, and the energy consumed by the IT equipment only. If the power consumed by a data centre were 2.5 MW of which only 1.0 MW powers the IT equipment, then the PUE would be 2.5 (which represent an average PUE for a typical data centre). The closer to unity the PUE is, the more efficient the data centre is. It is currently estimated that the more efficient data centres currently installed operate at a PUE of about 1.6.

In recent years, approaches such as adding baffles across the top of the hot and/or cold aisles, with doors or further panels across the end of the aisle to contain entrainment of the air have been made, leading to debate about whether it is more effective to 'contain' the cold aisle or the hot aisle. A baffle arrangement is for example proposed in WO 2006/124240 (American Power Conversion Corporation).

Some recent configurations have utilised a new generation of 'in-row' cooling units in-between the racks, or, attached to the rear rack door. These bring the advantage of concentrated cooling but carry a high risk of refrigerant leakage. A slightly different arrangement, potentially suffering from similar problems is described in EP1488305. EP1488305 discloses a plurality of cabinets forming a data centre, each cabinet housing a rack of IT equipment and each cabinet comprising an equipment cooling unit within the cabinet to provide cooling.

The data centre industry is also suffering from being unable to meet demand sufficiently quickly and from reacting to the need to make such data centres energy and space efficient. IT capacity has grown at an exponential rate, doubling about every 18-24 months, in the last 30 years. Cooling capacity and space limits are frequently and repeatedly reached creating significant bottlenecks in IT businesses. Building a new data centre to alleviate such bottlenecks and meet demand is time consuming. Traditional methods of constructing data centres can take up to 2 years to completion. Also, data centres are physically becoming larger year on year because current design and engineering practice seeks to deal with heat issues by assuming low rack density and spreading IT thinly across large numbers of racks or large volumes of space.

The present invention seeks to provide an improved data centre and/or an improved method of, or means for, cooling a data centre. Additionally or alternatively, the invention seeks to provide a data centre and/or a method of, or means for, cooling a data centre that mitigates one or more of the above-mentioned disadvantages.

SUMMARY OF THE INVENTION

The present invention provides a data centre building including:
  at least one rack room,
  one or more controllable air circulation systems,
  one or more cold aisles in the rack room,
  one or more hot aisles in the rack room, and
  an air supply corridor for transporting cooling air, above the floor, to the one or more cold aisles.

The air supply corridor may function also as a personnel access corridor. The air supply corridor may have a height greater than 1.5 m above the floor.

The data centre building may be a building in which all the interior space is taken up by the data centre. Of course, alternatively, the data centre building may be a building in which only part of the interior space is taken up by the data centre, with the rest of the interior space being available for other uses.

Each rack room may have a floor and a plurality of rack storage areas on the floor, each rack storage area being arranged to accommodate a plurality of racks (for example arranged in a single row) in which a plurality of rack-mountable electronic components may be housed. The racks may be already installed in the data centre building or the data centre building may be provided without racks. The rack storage areas may include fixings or other means on the floor for facilitating correct positioning of the racks when installed. Each cold aisle may be positioned adjacent to a rack storage area. Each hot aisle may be positioned adjacent to a rack storage area. Cooling air is preferably transported to the one or more cold aisles under the control of the one or more air circulation systems.

Thus, in an embodiment of the invention, an over-floor corridor may act as a cooling air duct. By using an over-floor corridor as a cooling duct, high rates of supply of air may be achieved whilst making efficient use of the space within the volume of the building.

The one or more air circulation systems may comprise one or more fans. Each fan may be sufficiently large to generate an air flow of at least $0.5 \text{ m}^3\text{s}^{-1}$. Each fan is preferably sufficiently large to generate an air flow of at least $1 \text{ m}^3\text{s}^{-1}$, and more preferably at least $5 \text{ m}^3\text{s}^{-1}$. Together the one or more air circulation systems may have sufficient capacity to generate an air flow of at least $5 \text{ m}^3\text{s}^{-1}$, and more preferably at least $10 \text{ m}^3\text{s}^{-1}$. There may be five or more fans. For example, ten or more fans may be provided, such fans collectively being able to generate an airflow of at least $50 \text{ m}^3\text{s}^{-1}$.

The hot or cold aisles may each be positioned between two adjacent rack storage areas. The hot or cold aisles may extend parallel to a rack storage area. The present invention also provides certain beneficial aspects which may have advantages in embodiments where there are no readily discernable hot and/or cold aisles. It will of course be appreciated that the skilled person may also be able, when considering a particular data centre building without racks installed therein, to discern which regions of the building would be deemed as the rack storage areas, as the hot aisles and as the cold aisles. The air supply corridor may be located wholly outside the rack room. More than one air supply corridor may be provided.

The air supply corridor may have a height greater than 1.5 m above the floor, for at least 90% of its length. The air supply corridor may have a large cross-sectional area, namely an area greater than $2 \text{ m}^2$, and preferably greater than $3 \text{ m}^2$. The air supply corridor may have such a large cross-sectional area for at least 90% of its length. The hot and cold aisles may each have cross-sectional area greater than $2 \text{ m}^2$, and possibly greater than $3 \text{ m}^2$.

In data centres of the prior art it is common to provide under-floor air ducts. Certain embodiments of the present invention remove the need for such under floor ducts. There is therefore no need to have a high raised floor in embodiments of the present invention. The upper surface of the floor may be less than 500 mm above the base of the building, for example. Better use may therefore be made of the vertical space available in a building of a given height. The height of buildings may for example be limited if the buildings are assembled off-site and transported via road or rail networks in a part-assembled or fully assembled state. Additionally, or alternatively, the under-floor space may be utilised for functions other than air-ducts. For example, cables or other services may be routed under-floor.

Preferably, the data centre building is so arranged that in use air flows along a path from said one or more air circulation systems via said corridor to at least one of the cold aisles, such that the air flow is substantially horizontal for the entire path. The path of air-flow is preferably entirely above floor level. The path of the air-flow may pass along at least part of an access corridor, separate from both (a) the one or more cold aisles and (b) the one or more hot aisles, the access corridor facilitating access from outside the building to one of the rack storage areas. The one or more air ducts and/or corridors via which cooling air (whether or not heated by IT equipment in the racks) flows may extend in a generally horizontal direction for at least 90% of their length and preferably extend only in a generally horizontal direction for substantially their entire length.

At least one rack room may comprise a plurality of racks. A row of racks may be provided at each rack storage area. The racks may stand, preferably directly, on the floor. Each rack may be arranged to house a plurality of rack-mountable electronic components, such as IT components. Each rack may be in the form of a rack having a multiplicity of slots arranged in a single column. There may be more than 20 slots per rack. The slots are preferably arranged such that a single IT component may be mounted in the slot. Such IT components may include server blades. The IT components may each be provided within a casing, for example a metal box. The casing may include one or more vents, for example grilles, at the front and rear of the casing to facilitate the flow of cooling air through the casing to cool the IT component during use. There may be one or more fans inside the casing. Preferably, there are at least 10 racks per rack room, and preferably more than 24 racks per rack room. One or more racks may be housed in a cabinet. There may be one cabinet per rack. One cabinet may alternatively accommodate a plurality racks. The cabinet preferably has a vent or vents provided on its front face. The cabinet may have a vent or vents provided on its rear face.

One of the hot or cold aisles may be arranged to act in use as an air duct. For example, the racks, and the adjacent floor and ceiling, may together define a volume in which air is entrained, causing a pressure difference across the rack, which in use allows air to bleed through the rack (i.e. to cool electric IT components mounted in the racks). The volume defined between adjacent rows of racks may include an inlet, for example at one end of the rows of racks, and outlets (from the perspective of said "volume") defined in the racks, but otherwise sealed so as to force air entering the volume to exit only via the racks. (Of course, from the perspective of IT equipment in the racks, the front of the racks may be considered as acting as inlets and the back of the racks as outlets.) The bottom of the racks may meet with the floor. The tops of the racks may meet with the ceiling. The racks may include, or abut, a region of wall that meets with either the floor or ceiling, in the case where the rack is shorter in height than the floor to ceiling height. Cabling may be held above or below the racks in cable ducts that run the length of the racks. The cable ducts are preferably provided above the racks. Cables may run from such cable ducts to IT equipment in the racks.

The air supply corridor and at least one of (a) the one or more cold aisles and (b) the one or more hot aisles, may conveniently provide access to the plurality of rack storage areas.

There may be a plurality of cold aisles. There may be a plurality of hot aisles. The aisles may be substantially straight along their length. The data centre building may be so arranged that a plurality of cold aisles are interleaved between a multiplicity of hot aisles. It will be appreciated that a "cold aisle" may be "cold" in the sense that it is upstream of the rack storage area in the direction of flow of cooling air, in use. It will also be appreciated that a "hot aisle" may be "hot" in the sense that it is downstream of the rack storage area in the direction of flow of air from the racks that has, in use, been heated by IT components in the racks. The hot aisle may be hot in the sense that the temperature in the hot aisle is, once a steady state has been achieved during operation, typically higher then the temperature in the cold aisle.

The data centre building may include an air supply duct for transporting cooling air to the plurality of racks. The air supply duct may optionally replace the function of the air supply corridor mentioned above. At least part of the air supply duct may be defined by means of the space between two adjacent racks. For at least 90% of the length of the air supply duct, the air supply duct may have a closed cross-section having an area of at least 2 $m^2$. Thus, in an embodiment of the invention, the racks entrain air-flow and the air duct has a large cross-section. The duct is preferably elongate in geometry. The maximum dimension of the duct (for at least 90% of its length) within the plane of the cross-section of the duct is preferably less than 4 m and more preferably less than 3 m. Whilst the duct preferably has a large cross-section it is also preferred that the duct is not excessively wide or tall, for example to assist with the entraining of the air flow. The air supply duct may extend from a source of cooling air, for example one or more fans, to a plurality of racks. Thus, the air supply duct may extend from the air circulation systems to the plurality of racks. At least part of the air supply duct may be defined by an access corridor. The air supply duct may include a vent controllable to vary the air flow along the duct. The air supply duct is preferably in fluid communication with the space between two different adjacent racks. There may be a plurality of vents, preferably controllable vents. In the case where there are two or more cold aisles, there may be a vent provided that is associated with each cold aisle. The air supply duct (and/or the air supply corridor) is preferably entirely located above floor-level. It will however be appreciated that certain benefits of certain aspects of the present invention may be retained in an embodiment of the invention in which part or all of the air duct is below floor level. For example, below a method of "hot-adding" a rack room to a data centre building is described, wherein such a method may be carried out whether or not the air supply duct is below floor level.

Above reference is made to the "length" of the air duct or the "length" of the air supply corridor. It will be understood that the length in question may be the length between the air circulation system(s) and the racks, when installed, or alternatively simply the length upstream of the racks.

The data centre building may be so arranged that there is at least one aisle in the rack room, the aisle being adjacent to a rack storage area, said at least one aisle including a doorway to the aisle, and an access door arrangement. The door arrangement may include a door movable between a closed position, closing the doorway, and an open position, allowing personnel access to the aisle. The access door arrangement may have a controllable air intake. The air intake may for example comprise a vent. The air intake and/or door may be arranged to move so as to scoop more or less air from an airflow. The air intake may be arranged to move so as to enlarge or reduce the effective cross-sectional area of one or more apertures. The controllable air intake may be controllable by moving the door. The door may be moved, whilst still closed, when varying the airflow. The door arrangement may include a door and a separate air-intake. The door may comprise the air intake. The building may be so arranged that, in use, cooling air flows via said doorway into or from the aisle, for example when the door is closed. The flow of air through the door, when in its closed position, is advantageously controllable by means of a controllable vent. Thus, in an embodiment of the invention, the access door into the data room has a controllable vent, so that the door has a dual function. It will be appreciated that the air flow regime of the building is arranged to function with all such doors normally being closed. Thus, the doors are arranged to be normally closed, for example only being opened when personnel access is required. In another embodiment of the invention, the door arrangement includes a door that is movable relative to the wall when the door is in its closed position to allow an air intake to scoop varying amounts of air from an air supply corridor. In this embodiment, the controllable air intake controls air flow via a different part of the door arrangement than the part through which personnel can gain access. The door arrangement may be located on the end of a cold aisle. The door arrangement may be located on the end of a hot aisle, in which case it will be appreciated that the "cooling air" that passes via the door will typically have been heated by the rack-mountable electronic components.

As mentioned above, the door may comprise a controllable vent. The vent may be moveable between an open position thus allowing air to pass via the vent and a closed position. When in the closed position, airflow via the vent (controllable air intake) may be restricted (preferably substantially prevented). The vent may comprise a row of vertical blades arranged for rotation about a vertical axis, such that the vent may be moved between closed and open positions by means of rotation of the blades. The blades may comprise at least one pair of adjacent blades that are arranged to rotate simultaneously in opposite directions. The blades are preferably arranged to rotate together to effect control of the flow of air through the vent. There may be two or more motors to move the blades. There are preferably six or more blades. The blades preferably extend across more than 50% of the width of the door. The blades preferably extend across more than 50% of the height of the door. The effective open area when the vent is open may be greater than 1 m². The vent is preferably arranged such that in the event of a failure the vent would fail "open".

The door arrangement preferably further comprises at least one motor for moving the controllable air intake between an open position thus allowing air to pass via the air intake and a closed position. The at least one motor is preferably arranged so that the amount of airflow through the door may be adjusted between three or more levels. The level of adjustment possible may be substantially continuous as between the fully closed and fully open positions. The door arrangement may be arranged to receive a control signal for controlling the operation of the at least one motor. The control signal is preferably set in dependence on measured characteristics of the air in or immediately outside the building.

The door arrangement described above may have independent application for use within a building, not necessarily a data centre. Also, it will be appreciated that the door arrangement could be provided separately from the data centre building. The present invention thus further provides a door arrangement that is arranged to be fitted within a wall space, the door arrangement including a door allowing human access therethrough and a controllable air intake arranged such that the flow of air through the door, when in its closed position, is controllable by means of the controllable air intake. The door arrangement is preferably arranged to receive a control signal for controlling the operation of a motor provided to move the controllable air intake. Other features mentioned above may be incorporated into this aspect of the invention.

The one or more controllable air circulation systems may be arranged to cause circulation of cooling air to rack storage areas under a controlled pressure regime. An air circulation control unit may be provided to control such a process. Pressure sensors may for example be provided to provide a measure of pressure in different regions of the data centre. The control unit may be arranged to receive signals representative of the pressure so measured, such signals being used to control the cooling of the data centre. The cooling and/or the pressure regime may of course be adjusted by means of controlling (automatically) the controllable air intake of the access door arrangement mentioned above. The data centre building may include an airlock room to facilitate control of the pressure regime. For example, the airlock room may allow access to a rack room, whilst maintaining the controlled pressure regime. The pressure regime may comprise maintaining differential pressures as between the pressure in a cold aisle and the pressure in a hot aisle, so that air flow is encouraged from the cold aisle to the hot aisle. The pressure regime may comprise maintaining differential pressures as between the pressure in a hot aisle and a downstream pressure, for example outside the building, to encourage extraction of air away from the hot aisle. The pressure regime may comprise maintaining differential pressures as between the pressure in a cold aisle and an upstream air duct or corridor. The differential pressure may be required upstream of a cold aisle simply to enable differential pressures downstream. The pressure differential between two successive points on the airflow route (for example either side of the racks or either side of an air intake dividing a rack room from an airflow) is preferably greater than 10 Pa, and preferably less than 100 Pa.

The airlock room preferably comprises two doors, one door allowing entry into the airlock room from a location outside of the area of controlled pressure regime and another door allowing entry into the area of controlled pressure regime. Preferably, an electronic control unit prevents the two doors from both being open at the same time during normal operation of the data centre. The control unit may for example allow the two doors to be open at the same time in the event of an emergency. The building may include a corridor that allows access between the airlock room and another room, for example a rack room. Such a corridor may also be arranged to allow passage of cooling air, for example to a rack room.

As mentioned above there may be a cold region, for example a cold aisle and a hot region, for example a hot aisle, the cold region being separated from the hot region by a rack. The rack may be a predominantly metal rack. Preferably, the metal rack includes insulation to reduce conduction and/or convection of heat from the hot region to the cold region. It has been found that adding a thermal insulating layer to shield the metal framework of the racks can significantly improve the thermal efficiency of the building. This is thought to be as a result of the surprisingly high effects of conduction of heat from the hot region, for example a hot aisle to the cold region, for example a cold aisle by means of conduction through the metal frame. Thus, in an embodiment of the invention, the racks are thermally insulated to prevent, or at least significantly reduce, (reverse) conduction of heat from the hot aisle to the cold aisle. The metal rack may include uprights, which extend along the lateral edges of the rack. The insulation preferably extends to cover the uprights. The rack will of course, in use, include one or more rack-mountable electronic components. In such a case, the insulation preferably covers substantially the whole of the front of the rack, apart from those regions occupied by the one or more rack-mountable electronic components. The insulation is preferably arranged so that slots in the rack for mounting of rack-mountable electronic components may be selectively covered (by insulating material) or exposed to allow insertion of an IT component (server blade for example). For example, the insulation may comprise a facing that extends across the front of the rack, wherein the facing includes a plurality of removable strips. Thus, each strip may be removably mounted to allow (on removal of the strip) for insertion of a rack-mountable electronic component into the rack. The insulation may comprise a portion that extends across at least one of the two sides of the rack. The rear of the rack may be open. The rack may additionally or alternatively include one or more blanking plates. For example, a blanking plate may be associated with each slot and a removable strip may also be associated with each slot. Such blanking plates may assist in reducing conduction of heat from the hot aisle to the cold aisle, but may also additionally or alternatively provide a better physical seal between the hot and cold aisles and thereby restrict convection of heat from the hot aisle to the cold aisle. Sealing the gaps that might otherwise exist in the area of the racks is important because otherwise cooling air may pass from one side of the racks to the other via such gaps thereby bypassing the rack-mountable electronic components which require cooling. Convection of heat from the hot aisle to the cold aisle may also be reduced by means of removably mounted vertical blanking strips filling the gap that might otherwise exist between adjacent racks. Such means may also assist in entraining air-flow through and/or directly over and around the rack-mountable electronic components. One or more cables may pass via the boundary between adjacent racks. As such the racks may advantageously include an aperture on each side to allow for passage of such cables. The aperture may be defined simply be means of the space between the front and rear vertical supports on one side of a rack, and the structure on the side of the rack may for example be substantially open.

The one or more controllable air circulation systems may form part of a single air cooling system with built in redundancy for ensuring continued operation of the data centre building in the event of failure of one of the parts of the air cooling system. The single air cooling system may be in the form of a separate module, as described in more detail below. The single air cooling system may for example comprise a multiplicity of fans including at least one fan more than necessary (at least N+1 redundancy). The air cooling system may include an active refrigerant-based cooling unit (possibly one only or possibly two for the sake of redundancy). The air cooling system may include a mechanical cooling unit for cooling air before it is used to cool equipment in the rack rooms. The mechanical cooling unit may comprise an air conditioning unit, for example having DX refrigeration coils. The mechanical cooling unit may comprise a non-refrigerant based cooling apparatus, for example a humidification unit, an evaporative cooling unit and/or an adiabatic cooling unit. Redundancy may be provided in the air circulation system by means of being designed for primary operation without refrigerant-based cooling. For example, the use of ambient air from outside the building can be used to cool the racks, provided that the temperature is below a maximum threshold temperature (for example 37 degrees Celsius). Use of ambient air, as the cooling air, can be sufficient (for example when utilising embodiments of the present invention in which ambient air is treated via a humidity-based cooling unit) for at least 97% of the duration of the operation of the data centre in certain climates. Thus, the 3% or less of the time where active refrigerant-based cooling is additionally required may be considered as an exceptional case, such that provision of a doubly redundant refrigerant-based active cooling system is rendered unnecessary. Thus, the data centre building may offer sufficiently robust and continuous operation without requiring two independent active refrigerant-based cooling systems (of the type requiring mechanical DX cooling, condensers, compressors, and the like).

The data centre building is preferably formed from a plurality of separate modules. One of the modules may be in the form of a rack room module accommodating a rack room. The rack room may include a plurality of racks in which a plurality of rack-mountable electronic components are housed. One of the modules may be in the form of an air circulation module. The air circulation module may accommodate one or more air circulation systems for transporting cooling air to a rack room. The air circulation module may include a multiplicity (for example four or more) of fans. The air circulation module may include an active refrigerant-based cooling unit (preferably one only) for cooling air before it is used to cool equipment in the rack rooms. The air circulation module may comprise one or more mechanical cooling units. Each rack room module may include a cooling air duct for transporting cooling air transported from an air circulation module to the rack room. Such a cooling air duct may extend from one side of the rack room module to an opposite side. One of the modules may be in the form of a services plant module. The services plant module may comprise power plant equipment. The services plant module may comprise fire suppression equipment. The services plant module may comprise control equipment for controlling cooling and powering of IT equipment in one or more rack rooms. The power plant equipment (in the services plant module) may include an uninterruptible power supply (UPS), for example including a battery back-up unit. The power plant equipment may include switchgear equipment. The power plant equipment may include electrical distribution equipment. One of the modules may be in the form of a personnel module. The personnel module may be arranged to provide secure access to the data centre building. The personnel module may include office space. The personnel module may include an airlock room. The personnel module may include a door providing access to one or more data rooms. One module, not itself being a rack room, may define a cold aisle, or more preferably a hot aisle, adjacent to a rack storage area in a rack room. In an embodiment described below, the services plant module (comprising the power plant equipment) includes a hot aisle, such that a corridor of the services plant module acts, in use, as an exhaust duct.

The data centre building preferably comprises at least one rack room module, at least one air circulation module, and at least one services plant module. According to certain embodiments of the invention, one air circulation module serves many rack room modules. Providing a data centre building in which a single air circulation module is able to serve more than one rack room modules enables a data centre building to be constructed having one or relatively few rack room modules and then adding further rack room modules as demand for IT capacity grows, without requiring the addition of an extra air circulation module. It will therefore be appreciated that there may be advantages to providing a data centre building having one or more rack room modules, and one or more air circulation modules, wherein all of the one or more air circulation modules have the capacity to cool more than all of the one or more rack room modules. For example, the one or more air circulation modules may have the capacity to cool at least twice as many rack room modules as are provided. The one or more air circulation modules may have more than three times the required capacity. For example, each single rack room may have a cooling requirement of at least 10 kW, or at least 50 kW. Some data centre designs may have rack rooms each having a cooling requirement of greater than 150 kW. A single air circulation module may have a cooling capacity of more than 200 kW, and possibly more than 300 kW, thus allowing for future expansion.

Each module may have a similar construction. Each module may comprise a frame structure having a rigid base from which there extends a multiplicity of vertical structural support columns. The frame structure may include two or more beams at the top of the frame each extending between a pair of the vertical support columns. The base may comprise a steel frame. The steel frame may be formed by means of a plurality of I-beams. The base may be formed from concrete supported on a steel framework or sheeting. The module may comprise a roof section. The base may comprise a timber floor fixed onto a frame. The base may be formed from board material supported on joists. The joists may be metal. Each module preferably has a length greater than 10 metres. Each module preferably has a length less than 20 metres. Each module preferably has a height greater than 2 metres. Each module preferably has a height less than 4.2 metres. Each module preferably has a width greater than 2.5 metres. Each module preferably has a width less than 5 metres. A module may include a wall extending upwards from at least one edge of the base. A module may have a base having an edge extending between two corners of the base, such that the edge (or at least a part of it) is not associated with a wall, thus defining a substantially open face of the module. The module may have an open face to cooperate with a corresponding open face of an adjacent module in a building, so that an open space (for example as part of a room or corridor of the building) is defined partly by one module and partly by an adjacent module. It will be appreciated that the open face may extend only part of the way along the edge of the base, there being a wall along the remaining part(s) of the edge. Each module is preferably shaped so as to be suitable for transportation by road. Each module preferably includes structure configured to allow the module to be lifted by, for example, a fork-lift.

When the modules are assembled to form the data centre building, there may be a gap between adjacent modules. The gap is preferably between 2.5 mm and 50 mm, preferably between 5 mm and 20 mm. The gap between adjacent modules is preferably filled with one or more sealing strips. The sealing strip may be metal.

The present invention also provides a method of cooling electronic equipment in a data centre building. The method may comprise a step of providing and then operating a data centre building according to the present invention as described or claimed herein. The method may include a step of cooling racks of items of electronic equipment by operating one or more air circulation devices to transport air above the floor via at least one access corridor, providing access to the racks. The method may include a step of removing air from the racks. The method may cause the removed air to be exhausted directly to the exterior of the building. The method may cause the removed air to pass via an access corridor. The access corridor preferably extends from a location outside of the rack room to a location inside the rack room. The access corridor may comprise a door. The access corridor need not be straight.

The air circulation devices may use one or more fans to push air through the building. The one or more exhausts may therefore be passive exhausts, in that the exhausts do not themselves assist extraction of air from the building. The passive exhausts may include one or more controllable vents.

The method may include a step of cooling racks of items of electronic equipment by operating one or more air circulation devices to transport air from outside the building at ambient air temperature to the racks, preferably without utilising refrigerant-based active cooling. The air may then be removed from the racks and exhausted to outside the building via at least one air exhaust. The one or more air circulation devices may be provided upstream of the racks. The one or more air circulation devices preferably provide a sufficient pressure differential, as compared to the air pressure immediately outside the building, to be able independently to cause air to be exhausted out of said at least one exhaust at a rate of at least 10 $m^3s^{-1}$ per rack room (or optionally at least 8 $m^3s^{-1}$ per rack room, or optionally at least 5 $m^3s^{-1}$ per rack room). Such rates might represent the higher end of the likely range of operational air exhaust rates. The data centre building may be arranged to operate at low IT demand levels with exhaust rates of the order of only 0.3 $m^3s^{-1}$ per rack room. In the case where there are for example, three or more (or optionally five or more) rack rooms in a building, or a floor thereof, air may be exhausted at a rate of at least 50 $m^3s^{-1}$ from the building (or floor of the building, as the case may be), when operating at high demand for example. Alternatively or additionally, air may be exhausted out of said at least one exhaust at a rate of at least 0.4 $m^3s^{-1}$ per rack. If there are 24 racks in a rack room, such a rate would be equivalent to about 10 $m^3s^{-1}$ per rack room. Alternatively or additionally, air may be exhausted out of said at least one exhaust at a rate of at least 0.002 $m^3s^{-1}$ per slot in the racks in the room. If there are 40 racks in a rack room and 40 slots per rack, such a rate would be equivalent to about 3.2 $m^3s^{-1}$ per rack room. Alternatively or additionally, air may be exhausted out of said at least one exhaust at a rate of at least 0.005 $m^3s^{-1}$ per rack slot, preferably at a rate of at least 0.008 $m^3s^{-1}$ per rack slot. At low demand, the air may be exhausted out of said at least one exhaust at a rate of as little as 0.00024 $m^3s^{-1}$ per rack slot. If there are 24 racks in a rack room and 40 slots per rack (of which at any given time 10 or more are each closed over by a blanking strip thereby restricting or preventing the flow of air therethrough), such a rate may be equivalent to less than 0.2 $m^3s^{-1}$ per rack room. Air may be exhausted out of said at least one exhaust at a rate of at least 0.01 $m^3s^{-1}$ per rack slot, or possibly at least 0.15 $m^3s^{-1}$ per rack slot (such rates again representing the higher end of the range of likely operational exhaust rates). Thus, in an embodiment of the invention, a sufficiently large volume of air per second is used to effect "ambient air" cooling of the IT equipment in the data room. There may therefore be less of a need for use of refrigerant-based active cooling. In certain embodiments of the invention, there is for example no need for CRAC units to be provided. This means of cooling may be used even when the ambient air temperature outside is higher than 20 degrees Celsius. Preferably, the method includes a step of operating the data centre and cooling it by means of airflows where the rate of exhaust is greater than 5 $m^3s^{-1}$ per rack room and also a step, performed at a different time, of operating the data centre and cooling it by means of airflows where the rate of exhaust is less than 1 $m^3s^{-1}$ per rack room.

There may be fewer exhausts than there are rack rooms. There may be at least 10 racks per room, preferably more than 20 racks per room. Each building may include more than two rack rooms. Preferably, however, there are fewer than ten data rooms/rack rooms per floor of the building. Each rack may have more than 10 slots for insertion of separate IT equipment units. Each rack may have more than twenty such slots. Thus, each rack room may, when operating at full capacity, accommodate over 500 separate equipment units, and possibly more than 1,000.

The method may extract heat at a rate of at least 5 kw per rack room module, or optionally at a rate of at least 10 kw per rack room module. When IT demand is high, there may be a need for higher heat extraction rates. The method may extract heat at a rate of at least 50 kw per rack room module, and possibly at a rate of at least 80 kw per rack room module. Such heat extraction rates may be achieved solely with ambient air cooling.

The method may additionally include a step of detecting fire or smoke. In the event that fire or smoke is detected, the method may include a step of ceasing transport of air from outside the building. Such a step may be conducted under the control of a fire suppression control unit. The method may also include a step of closing the one or more air exhausts. The method may include a step, in the event that fire or smoke is detected, of causing cooling air to be re-circulated. For example, the items of electronic equipment may be cooled by operating the one or more air circulation devices to transport air from within the building, to the racks and then from the racks back to the air circulation devices, with an optional step of cooling the air (for example by means of mechanical cooling equipment). Once air is being re-circulated within the building, a fire suppression control unit may then be able to discern whether the fire/smoke previously detected was from outside the building or inside the building. If fire or smoke continues to be detected, then appropriate action may be taken. For example, fire suppression gas may be released into the data centre building. Embodiments of the present invention enable rapid deployment of fire suppression gas throughout the data centre building as a result of the large volume of air/gas that is able to flow through the building per second.

The present invention yet further provides a method of building a data centre building. The data centre building so built may be in the form of a data centre building according to the present invention as described or claimed herein. The method of building the data centre building may comprise a step of extending an existing modular data centre building, in which there is provided at least one rack room module accommodating a rack room having a plurality of racks in which a plurality of rack-mountable electronic components are housed. There may be an air circulation module accommodating one or more air circulation systems for transporting cooling air to said at least one rack room in each rack room module. Each rack room module may include a cooling air duct for transporting such cooling air from the air circulation module to the rack room, the cooling air duct extending from one side of the rack room module to an opposite side. The step of extending an existing modular data centre building is advantageously conducted whilst the plurality of rack-mountable electronic components in each rack room of the existing building are operated and cooled by means of air from said at least one air circulation module. The method may include a step of adding a further (new) rack room module accommodating a rack room and having a cooling air duct extending from one side of the rack room module to an opposite side, such that an end of the cooling air duct on one side of the further (new) rack room module is aligned with an end of the cooling air duct on one side of a rack room module of the existing modular data centre building. The method may then include a step of connecting the cooling air duct of the further (new) rack room module with the cooling air duct of the rack room module of the existing modular data centre building. The method may include a step of removing an end portion of the building (for example a further module, optionally in the form of a personnel module) from the end of the existing data centre building to expose the side of the rack room module at the end of the existing building to which the extension is to be added. The method may include a step of blocking off an end of the cooling air duct of the rack room module of the existing modular data centre building before such an end portion of the building is removed. By utilising a modular building technique a "hot add" (i.e. allowing continuity of operation of the IT equipment in the data centre building) of an extra rack room may be achieved in a matter of days (for example less than 48 hours), as compared to previous timescales of the order of weeks.

The invention also provides a rack room building module for building a data centre installation, wherein the module comprises:

a base for supporting a floor, a plurality of racks for housing a plurality of rack-mountable electronic components, and an above-floor cooling air duct extending from one side of the rack room module to an opposite side.

In an embodiment of the invention, the rack room building module comprises a steel frame having the dimensions of an ISO shipping container. It may be constructed so as to be suitable for transporting as a shipping container. Advantageously, this embodiment of the invention may be used both in easily accessible areas such as city centres and in remote areas.

It will of course be appreciated that features described in relation to one aspect of the present invention may be incorporated into other aspects of the present invention. For example, the method of the invention may incorporate any of the features described with reference to the apparatus of the invention and vice versa.

The present invention further provides a method of constructing a data centre in a building. The method may include the steps of:

(a) providing a space within the building;
(b) providing at least one hole in an external wall of the building through which outside air may enter the space and/or inside air may leave the space;
(c) providing at least one partition to be installed in the space;
(d) installing the at least one partition in the space such that the partition(s) define:
at least one rack room having a floor and a plurality of rack storage areas on the floor, each rack storage area being arranged to accommodate a plurality of racks in which a plurality of rack-mountable electronic components may be housed;

one or more cold aisles in the rack room, each cold aisle being adjacent to a rack storage area, one or more hot aisles in the rack room, each hot aisle being adjacent to a rack storage area, and;

an air supply corridor for transporting, under the control of the one or more air circulation systems, cooling air, above the floor, to the one or more cold aisles, the air supply corridor having a height greater than 1.5 m above the floor;

(e) installing in the space one or more controllable air circulation systems.

Advantageously, the method provides a data centre that can be used in locations where the construction of a new building may not be possible or desirable, such as in city centres. The method may also be used by an organisation with an existing data centre or data room to easily upgrade the existing data centre or data room to use the present invention, thereby improving its efficiency. Alternatively, it may be used in a building that has been purpose-built to accommodate a data centre constructed according to the method.

The present invention also provides a kit of parts for constructing a data centre in a space within a building, wherein the kit includes at least one partition arranged for installation in the space such that the partition(s) and the space cooperate so as to define:

at least one rack room having a floor and a plurality of rack storage areas on the floor, each rack storage area being arranged to accommodate a plurality of racks in which a plurality of rack-mountable electronic components may be housed;

one or more cold aisles in the rack room, each cold aisle being adjacent to a rack storage area, one or more hot aisles in the rack room, each hot aisle being adjacent to a rack storage area, and;

an air supply corridor for transporting, under the control of the one or more air circulation systems, cooling air, above the floor, to the one or more cold aisles, the air supply corridor having a height greater than 1.5 m above the floor.

DESCRIPTION OF THE DRAWINGS

Embodiments of the present invention will now be described, by way of example only, with reference to the accompanying schematic drawings, of which.

DETAILED DESCRIPTION

Figure 1:
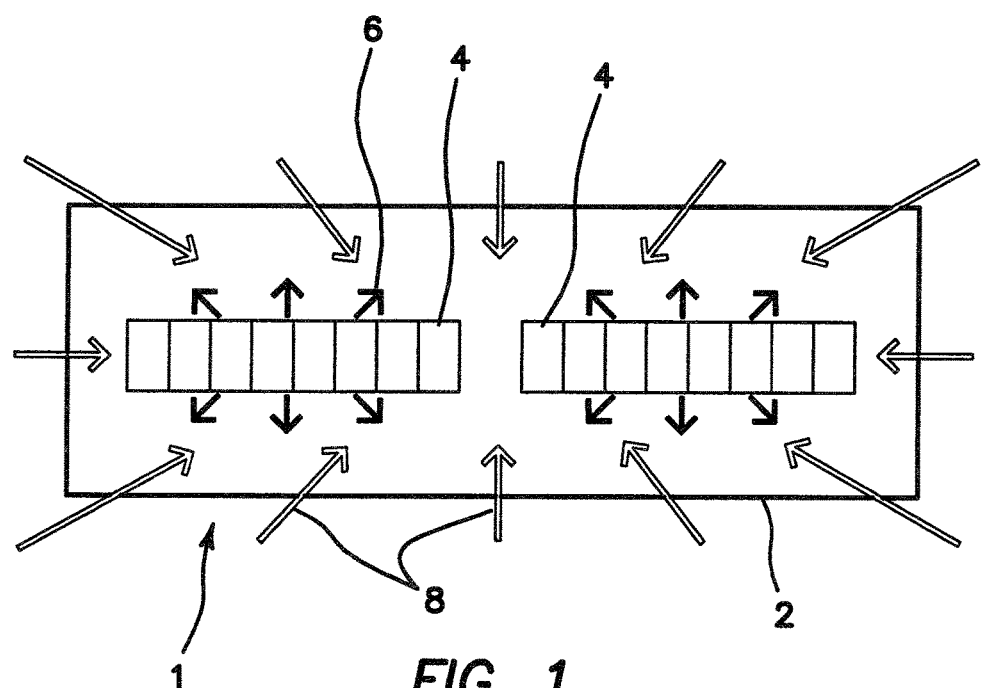
FIG. 1 shows a prior art rack room.
Figure 2:
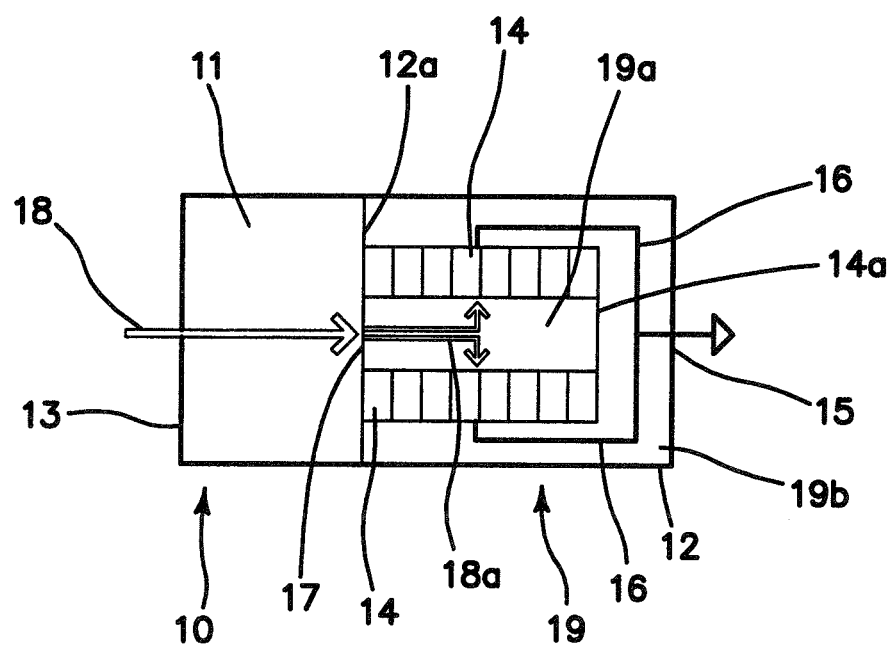
FIG. 2 is a very schematic drawing showing a data centre building according to an embodiment of the invention.

FIG. 2 shows a data centre building 10. The building 10 is rectangular with external walls 12. The building is divided into front and rear sections by an internal dividing wall 12a, located approximately one third of the length of the building from the rear external wall.

The rear section (on the left in FIG. 2) defines an air optimisation room 11, which provides a system of circulating cooling air in the building 10. Ambient air (represented by the light arrow 18) can enter the air optimisation room 11 through an ambient air intake 13 in the rear external wall. Ambient air 18 can be treated/cooled in the air optimiser room and this air 18a is then used for cooling. If the ambient air outside the building 10 is sufficiently cool, the ambient air may be used as cooling air, without requiring any active refrigerant-based cooling by the air optimisation room 11. Cooling air 18a passes into the front section of the building 10 through a controllable vent 17 in the internal dividing wall 12a.

The front section (on the right in FIG. 2) of the building 10 defines a rack room 19. The rack room 19 houses two rows of racks 14. The racks 14 extend away from the internal dividing wall 12a, towards the front of the building. Each rack row extends approximately out to two thirds of the length of the front section of the building. Although only shown schematically in FIG. 2, there are 20 racks in each row, each rack housing up to 40 items of IT equipment (typically server blades). There may therefore be as many as 1,600 items of IT equipment in the racks. A blanking panel 14a extends between the front ends of the two rows of racks, thereby defining a cold region 19a between the internal dividing wall 12a, the two racks 14 and the blanking panel 14a.

A hot region 19b is defined on the other side of the racks 14 and the blanking panel 14a. Air can escape from the hot region 19b though a hot air exit 15 in the front external wall of the building.

In use, ambient air 18 enters the air optimisation room 11 through the ambient air intake 13. The ambient air 18 is cooled/treated as necessary in the air optimisation room 11 resulting in cooling air 18a, which enters the rack room 19, into the cold region 19a, via the vent 17. The cooling air 18a moves over the racks 14 in the rack room 19 to reach the hot region 19b and in the process cools the racks 14. The resulting hot air (indicated by dark arrows 16) coming off the racks 14 then leaves the rack room through the hot air exit 15. It will of course be appreciated that the hot air 16 is simply the result of the cooling air 18a having been heated by the equipment in the racks 14 and is otherwise essentially the same air. As such the operation may be considered as involving the flow of cooling air into the rack room 19, the flow of cooling air via the racks 14 and then the flow of cooling air (then heated by the racks such that the "cooling air" may then have less, if any, ability to cool) out of the rack room. As such "hot air" or "exhaust air" can be considered as heated or used "cooling air". In the Figures air upstream of the racks is indicated by light arrows and downstream or exhaust air is indicated by dark arrows.

The volume of air flow through the building may, during certain conditions for example when outside temperature is relatively high and/or IT loads are relatively high, be at least 12 $m^3s^{-1}$. The air optimiser module has the capacity to generate air flow through the building at a rate as high as at least 40 $m^3s^{-1}$ (i.e. more than about 1 $m^3s^{-1}$ per rack and about 0.025 $m^3s^{-1}$ per rack slot, assuming that substantially all air flowing through the building passes via a rack slot). The volume of air flow through the building may during other occasions be about 0.3 $m^3s^{-1}$, during certain conditions. Such a rate of supply of air may still be sufficient to cool the IT equipment in the single rack room of the building by means of ambient air cooling alone for ambient air temperatures of up to 24 degrees Celsius.

Figure 3:
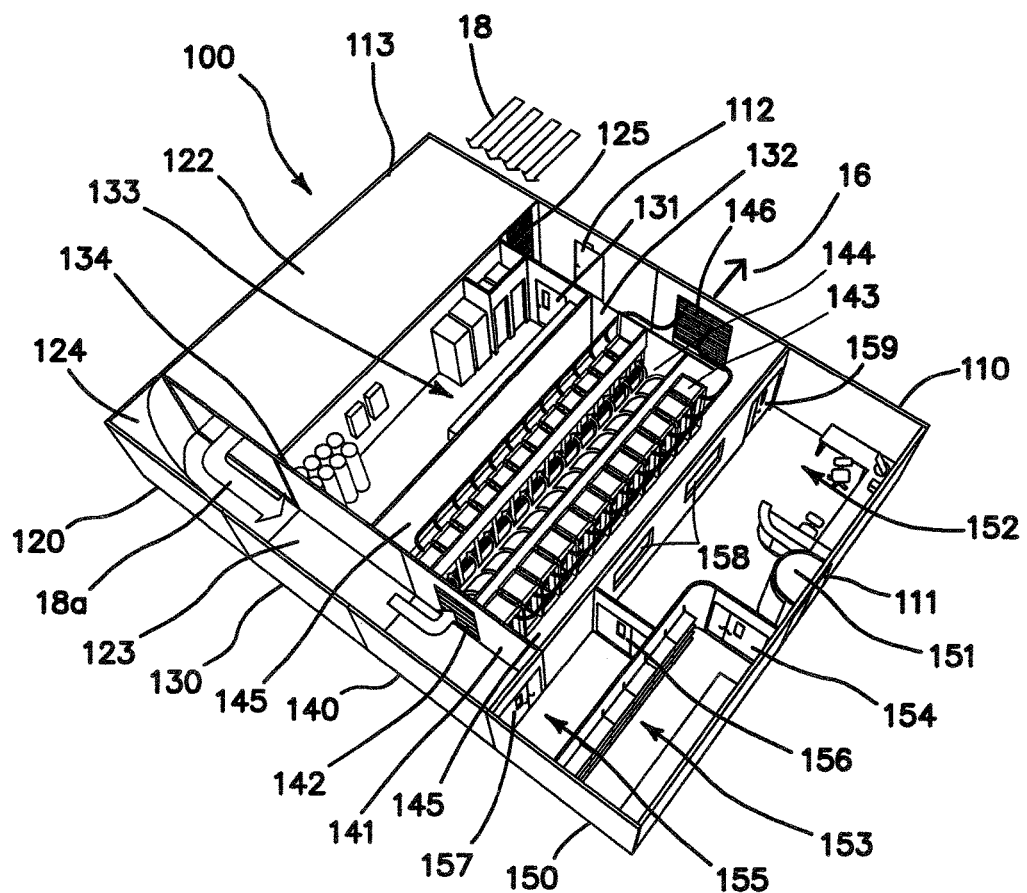
FIG. 3 shows a data centre building according to another embodiment of the present invention.

FIG. 3 shows a rectangular data centre building 100 with external walls 110 and a flat roof of a further embodiment.

At the front of the building 100 is a hole in the external wall defining an entrance 111. On a right side of the building, towards the rear is a second hole in the external wall defining a fire exit 112. Also on the right side of the building, behind the fire exit 112 is a hole defining an ambient air intake hole 113 (not visible). In front of the fire exit 112 but also on the right side of the building is a hole defining a hot air outlet hole 114.

The data centre building 100 is made up of four rectangular modules that are placed side to side so that the long sides of the rectangular modules are adjacent each other. The ends of the rectangular modules form the external side walls of the building. The external walls of the modules are formed from steel frames that are welded and bolted.

The floor of the modules is formed from steel frames and joists. The floor panels additionally have timber floorboards. The roof is constructed from a suitable weatherproof panel system and watertight membrane, including falls to one side of the roof and external drainage collection. The wall panels of the modules are formed from highly insulated steel panels, with a fire resistance of at least one hour. In addition, the wall and roof panels may also be constructed with magnetic shielding, RF or X-ray protection. The internal finish of the walls and ceiling is a plastic coated galvanised steel finish.

The modules are connected to each other by using modular wiring systems or quick disconnects on mechanical pipework. Hence, the modules can be easily connected and disconnected from each other.

In the embodiment shown in FIG. 3, there is an air optimisation module 120 located at the rear of the building 100, a plant room module 130 located in front of the air optimisation module 120, a rack room module 140 located in front of the plant room module 130 and a personnel module, here in the form of an entry module 150, located in front of the rack room module 140, at the front of the building 100.

Figure 5:
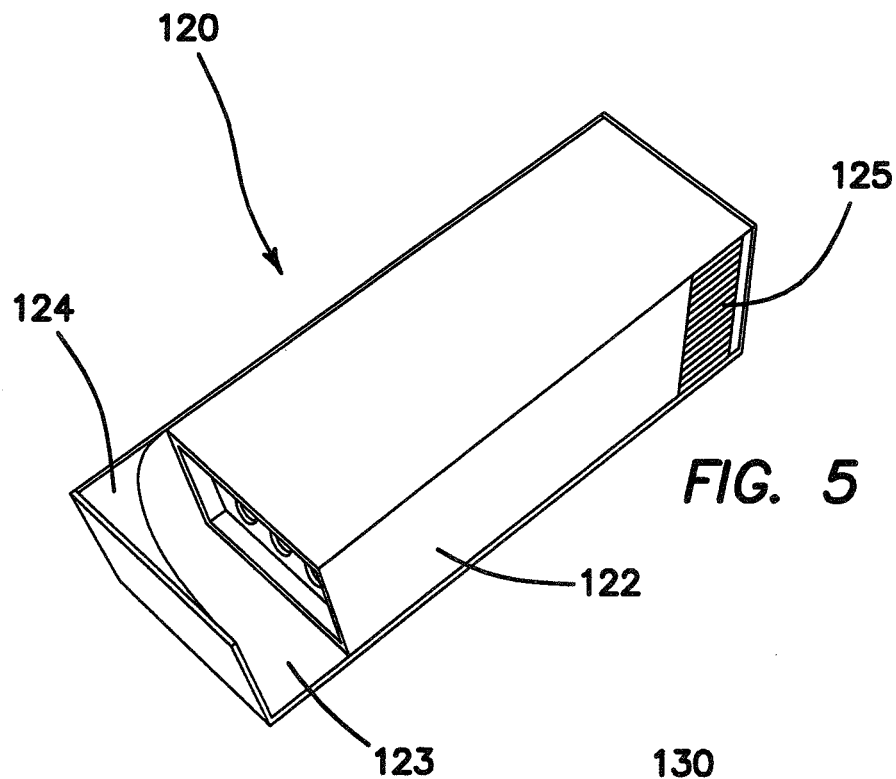
FIG. 5 shows the air optimisation module of the data centre building of FIG. 3.

The air optimisation module 120, shown most clearly in FIG. 5, includes the rear external wall of the building 100 and the rearmost parts of the left and right side walls of the building.

The air optimisation module 120 contains an air optimisation unit 122 located at the rear, right corner of the building. The air optimisation unit 122 is located adjacent the external right side wall of the building 100 so that an ambient air intake grille 121 (not visible) on one end of the unit 122 lines up with the ambient air intake hole 113. The ambient air intake grille 121 includes vents that are controllable so that the amount of air entering the air optimisation unit 122 through grille 121 can be controlled.

The air optimisation unit 122 also has a second air intake in the form of a return air grille 125. The return air grille 125 is located at the right, front end of the optimisation unit 122, near the end wall including the ambient air intake grille 121. The return air grille 125 includes vents that are controllable so that the amount of air entering the air optimisation unit 122 through grille 125 can be controlled.

The air optimisation unit 122 contains various air treatment apparatus, including banks of fans, air filters, humidification apparatus and an active DX cooling system. The DX cooling system includes soft copper refrigeration pipework. The humidification apparatus is used to provide adiabatic cooling during use. The air optimisation unit 122 also contains an air mixing box (not shown) for mixing the air from return air grille 125 and ambient air intake grille 121. The unit 122 also contains sound attenuation apparatus.

To the left side of the air optimisation unit 122 is an air supply corridor 123. The air supply corridor 123 runs from the rear external wall, and along and in between the left side of the air optimisation unit 122 and the left external side wall. A curved wall 124 is located in the rear, left corner of the building to help direct air from the air optimisation unit 122 along the corridor 123.

The floor of the air optimisation unit 122 is a non-slip safety floor.

Figure 6:
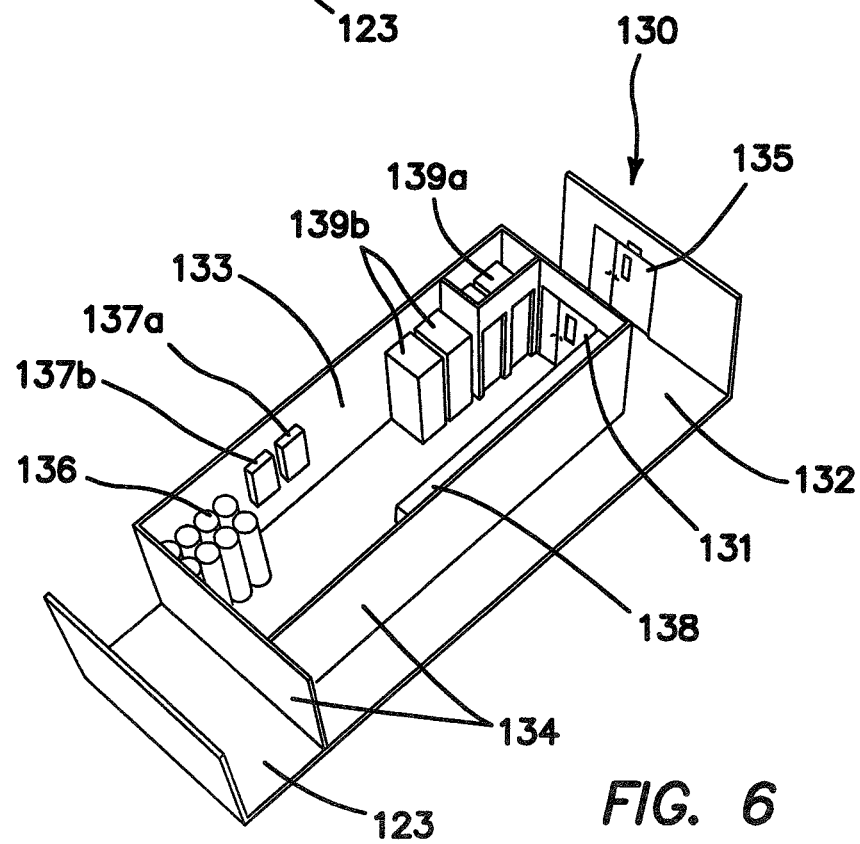
FIG. 6 shows the plant room module of the data centre building of FIG. 3.

The plant room module 130, shown most clearly in FIG. 6, includes two parts of the two external side walls of the building.

The plant room module 130 contains a rectangular plant room 133 defined by plant room walls 134. The plant room 133 is located centrally along a rear side of the plant room module 130. When the air optimisation module 120 and the plant room module 130 are joined, the plant room 133 sits against the front side of the air optimisation module 120 and the left end of the plant room 133 lines up with the left end of the air optimisation unit 122.

At the left, front end of the plant room 133, plant room wall 134 is extended to the front side of the plant room module 130. Hence, a passageway running along and in between the left external side wall of the building and the plant room wall 134 is defined. This passageway runs along the width of the plant room module 130 and is closed off from the plant room 133 and the rest of the plant room module 130 by the plant room walls 134. The passageway joins up with and forms part of the air supply corridor 123.

To the right side of the plant room module 130 is a hot air corridor 132 running along the width of the plant room module 130 and along the external side wall of the building containing the fire exit 112. The plant room module 130 contains a fire exit door 135 over the fire exit 112. When the air optimisation module 120 and plant room module 130 are joined together, the hot air corridor lines up with the return air grille 125.

The hot air corridor 132 also extends around the front of the plant room 133, in between the front plant room wall 134 and the front of the plant room module 130. This corridor extends up to the right side of the extended plant room wall 134. This allows air from the rack room module 140 (located in front of the plant room module 130) to enter the hot air corridor 132.

On the left end wall of the plant room 133 is a plant room access door 131. The door 131 allows access to the plant room 133 from the hot air corridor 132.

The plant room 133 contains various apparatus, including fire suppression gas discharge canisters 136 and associated manifold and valves, a power metering panel 137a for monitoring the power consumed by each rack in the rack room module 140, a dual electrical distribution panel 138, an uninterruptible power supply 139a and back-up batteries 139b. These apparatus are mounted on the internal sides of the plant room walls 134.

The plant room 133 also contains a process control panel 137b, including a VESDA (Very Early Warning Smoke Detection Apparatus) fire detection monitoring panel, mounted on an internal side of the plant room walls 134. The process control panel 137b receives data from various sensors including sensors in the rack room module 140 and an outside ambient air temperature sensor. This outside ambient air temperature sensor may be placed outside the building 100 or just inside the building 100, near the ambient air intake grille 121. It uses this information to control the fans, humidification apparatus, cooling system and controllable vents in the building in order to achieve effective cooling of the racks in the rack room module 140.

The fire suppression gas discharge canisters 136 are connected to the air optimisation unit 122 so that in the event of a fire (when the VESDA monitoring panel is triggered), gas from the canisters 136 can be discharged through the air optimisation unit 122 into air supply corridor 123.

The uninterruptible power supply 139a and back-up batteries 139b are designed to provide 10 minutes of power in the event of failure of an external power supply. The batteries are provided with their own dedicated cooling system.

The floor of the plant room 133 is a non-slip safety floor.

Figure 7:
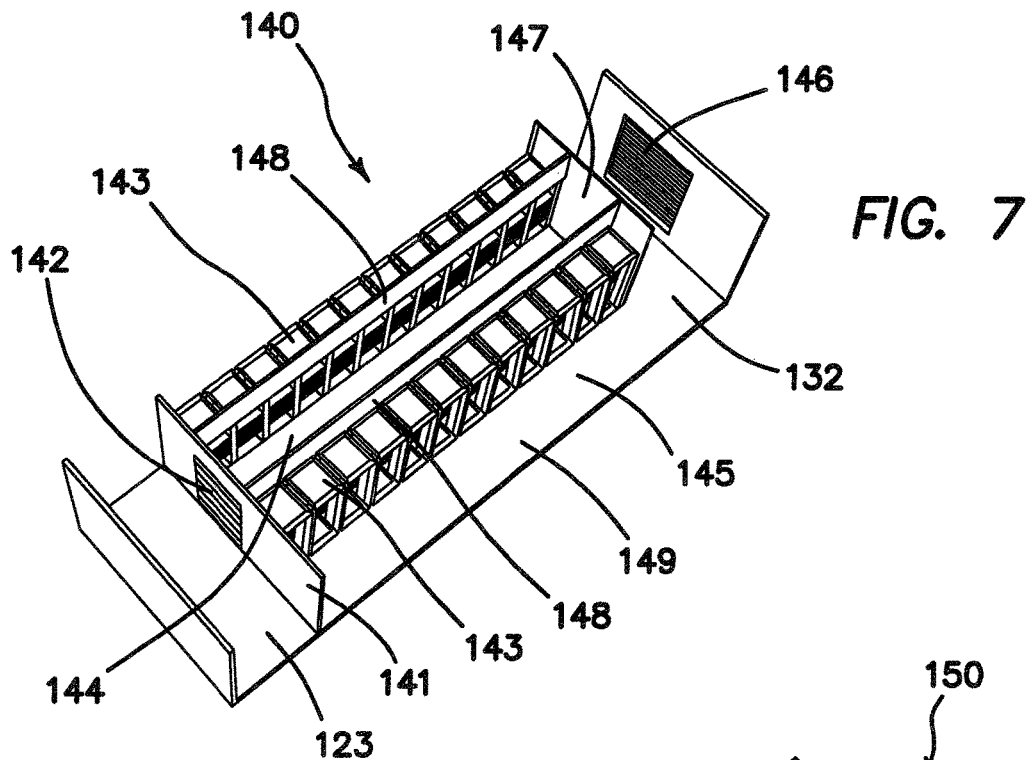
FIG. 7 shows the rack room module of the data centre building of FIG. 3.

The rack room module 140, shown most clearly in FIG. 7, includes parts of the external side walls of the building.

The rack room module 140 contains two elongate rectangular rack storage areas, the areas being parallel to each other. The areas are together positioned centrally along a rear side of the rack room module 140. At the left end of the rack storage areas is an internal wall 141 running along the width of the rack room module 140. When the plant room module 130 and the rack room module 140 are joined, the rack storage areas sit against the plant room module 130 and the internal wall 141 lines up with the left end of the air optimisation unit 122 and left wall 134 of the plant room 133.

Hence, a passageway running along and in between the left external side wall of the building and the internal wall 141 is defined. This passageway runs along the width of the rack room module 140 and is closed off from the rack room area and the rest of the rack room module 140 by the internal wall 141. The passageway joins up with and forms part of the air supply corridor 123.

Each rack storage area is effectively defined by a single row of racks 143 running lengthways along the rack room module 140, i.e. widthways across the building, from the internal wall 141 to the right end of the rack room area. The two rows of racks 143 are separated by a cold aisle 144.

At the right end of the rack room area, spanning across the ends of both rack rows, is a cold aisle blanking panel 147 designed to close off the cold aisle 144 at the right end. At the top of both rows of racks 143 are over-rack blanking plates 148 designed to stop cold air travelling over the racks 143 between the top of the racks and the ceiling of the rack room module 140. Hence, air can only leave the cold aisle 144 through the racks 143. There is no personnel access possible from the cold aisle 144 directly to the other side of the racks 143.

Air from the supply air corridor 123 can enter the cold aisle 144 through cooling air intake grille 142, located on the internal wall 141 in between the rows of racks 143. The grille 142 includes vents that are controllable by the process control panel 137b so that a desired air pressure regime can be achieved. The cooling air intake grille 142 is part of a securable door that can be opened and closed to allow personnel access from the air supply corridor 123 to the cold aisle 144 of the rack room module 140. The cooling air intake grille door 142 is made from aluminium and/or steel.

The rearmost row of racks 143 is located adjacent the passageway in the plant room module 130 that joins up with the hot air corridor 132. Hence, hot air coming from the rearmost rack 143 is directed to the hot air corridor 132 via this passageway. Hence, the passageway is defined as a hot aisle 145.

Around the right end and along the front side of the front rack is a passageway that joins up with and forms part of the hot air corridor 132 running along the right side of the building 100. Hence, hot air coming from the other (foremost) rack 143 is directed to the hot air corridor 132 via this passageway. Hence, the passageway is also defined as a hot aisle 145.

On the right end wall of the rack room module 140 is a hot air outlet grille 146 corresponding to the hot air outlet hole 114. The grille 146 has vents that are controllable by the process control panel 137b so that the amount of hot air 16 that is exhausted from the building 100 through hot air outlet grill 146 can be controlled.

Figure 18:
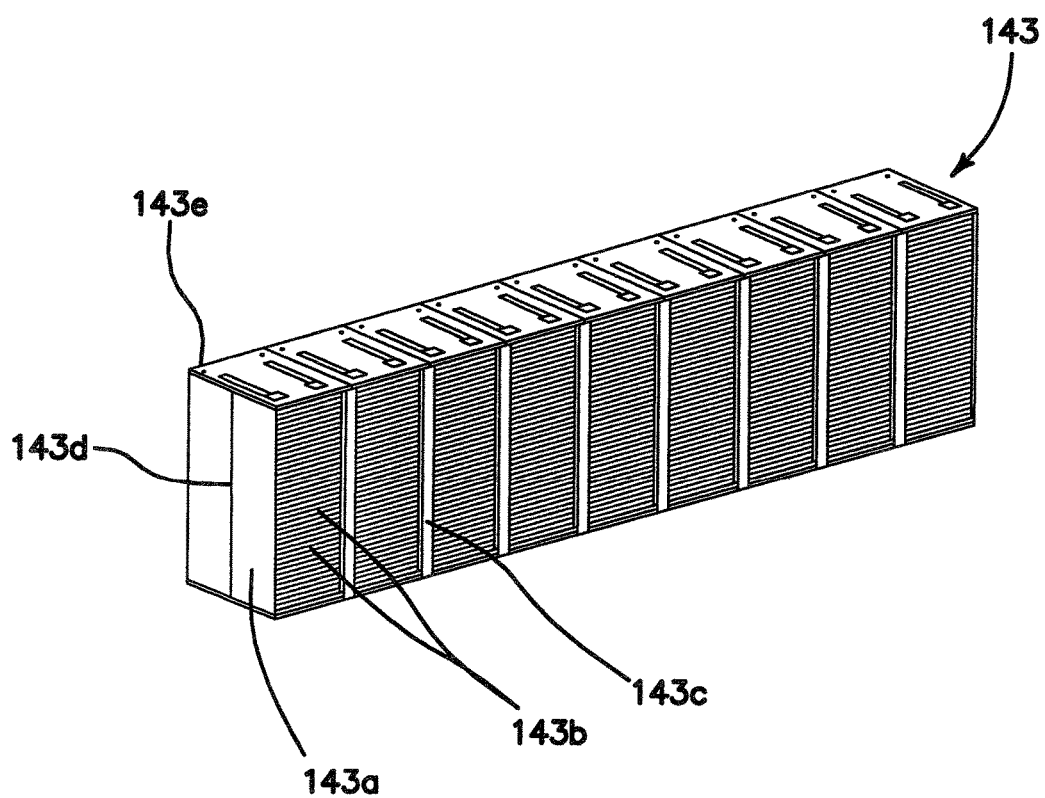
FIG. 18 is a perspective view of a rack row for use in embodiments of the present invention.

FIG. 18 shows a row of racks 143 in more detail. The rack frames 143a are made of metal. Each rack is an open fronted 42u standard universally compatible server rack. The racks are joined together in rows by filler pieces 143c. The filler pieces can be a plain infill panel, a vented infill panel (including a mesh panel on the filler piece), a power distribution support infill panel or a cable management infill panel. It is preferred for the filler pieces 143c to be in the form of vertically extending blanking strips that seal the racks and thereby restrict undesirable heat convection. Cables are run vertically to the top of the racks through the cable management panels and guided through cable trays (not shown) at the top of the racks. Cables can then be run down one side of the row of racks 143 in cable trough 143d. Hence, the cable is kept out of the air flow and this improves efficiency. A gasket seal 143e is provided around the top of the racks 143 to provide a seal against air flow.

Each rack is fitted with a "42u" insulation strip. The insulation strip is made up of individual blanking strips 143b that can be removed from the racks. Each individual blanking strip 143b corresponds in height to the height of each unit space on the rack. Hence, individual blanking strips 143b can be placed on the racks to cover any area not occupied by electronic components in the racks. The strips 143b can be removed to allow additional electrical components to be inserted in the racks 143. The strips 143b reduce the conduction of heat from the hot aisles 145 to the cold aisle 144. Insulation material is also placed on the over-rack blanking plates 148 and cold aisle blanking panel 147 (not shown in FIG. 18). Thus, the metal rack includes a thermally insulating barrier that reduces flow of heat from the hot aisle to the cold aisle via heat conduction across the metal rack.

A floor 149 of the rack room module 140 has an anti-static vinyl covering.

The rack room module 140 also contains sensors for measuring the air temperature, humidity level, pressure and air flow. These sensors are connected to the process control panel 137b in the plant room 133.

Figure 8:
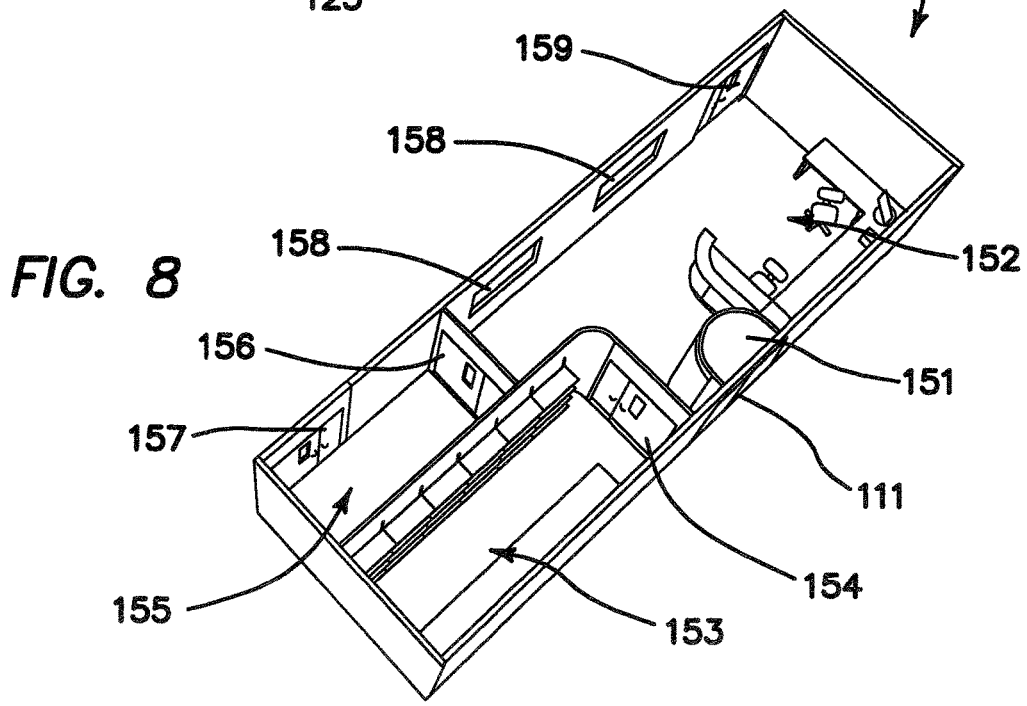
FIG. 8 shows the entry module of the data centre building of FIG. 3.

The entry module 150, shown most clearly in FIG. 8, includes the front external wall and the foremost parts of the external side walls of the building.

The entry module 150 has an entry portal 151 located adjacent the entrance 111 to the building 100. The entry portal 151 is a semi-circular door surrounding the entrance 111 to the building. Hence, upon entering the building, personnel pass through the entrance door 111 into a semi-circular space defined by the entry portal 151 and then through the semi-circular entry portal 151 itself. The entry module 150 also has a security/reception area 152, located to the left and to the rear of the entry portal 151.

On the right side of the entry module, in the front right corner of the building 100, is a storage and IT staging room 153, accessed through a door 154. To the rear of the storage and IT staging room 153, located in the right, rear corner of the entry module 150, is an air lock room 155. The air lock room 155 is accessed from the security/reception area 152 through an air lock access door 156. An air supply corridor access door 157, adjacent the right side wall of the building, provides access from the air lock room 155 to the air supply corridor 123 of the rack room module 140.

The air supply corridor access door 157 can only be opened when the air lock access door 156 is closed. Similarly, the air lock access door 156 can only be opened when the air supply corridor access door 157 is closed. Hence, loss of air pressure of the air supply corridor can be reduced, while still allowing personnel access to the air supply corridor 123 and cold aisle 144, through the door of the cooling air intake grille 142.

On the rear side of the entry module 150 are two central windows 158 allowing personnel in the entry module 150 to see into the rack room module 140.

In the right, rear corner of the entry module 150 is a hot air corridor access door 159. This door 159 links up to the hot air corridor 132 of the rack room module 140 and hence allows personnel access to the hot air corridor 132, the rear of the racks 143 facing the hot aisles 145 and the plant room 133, through plant room access door 131.

The floor of the entry module 150 is a non-slip safety floor.

The plant room 133 and the entry module 150 contain their own heating and ventilation system that is not connected to the supply of air from the air optimisation unit 122. The heating system includes an electric panel heater with an integral thermostat.

All external doors of the building 100 (i.e. entrance 111 and fire exit door 135) are made from aluminium or steel. The doors can contain double glazed window panels.

Figure 4:
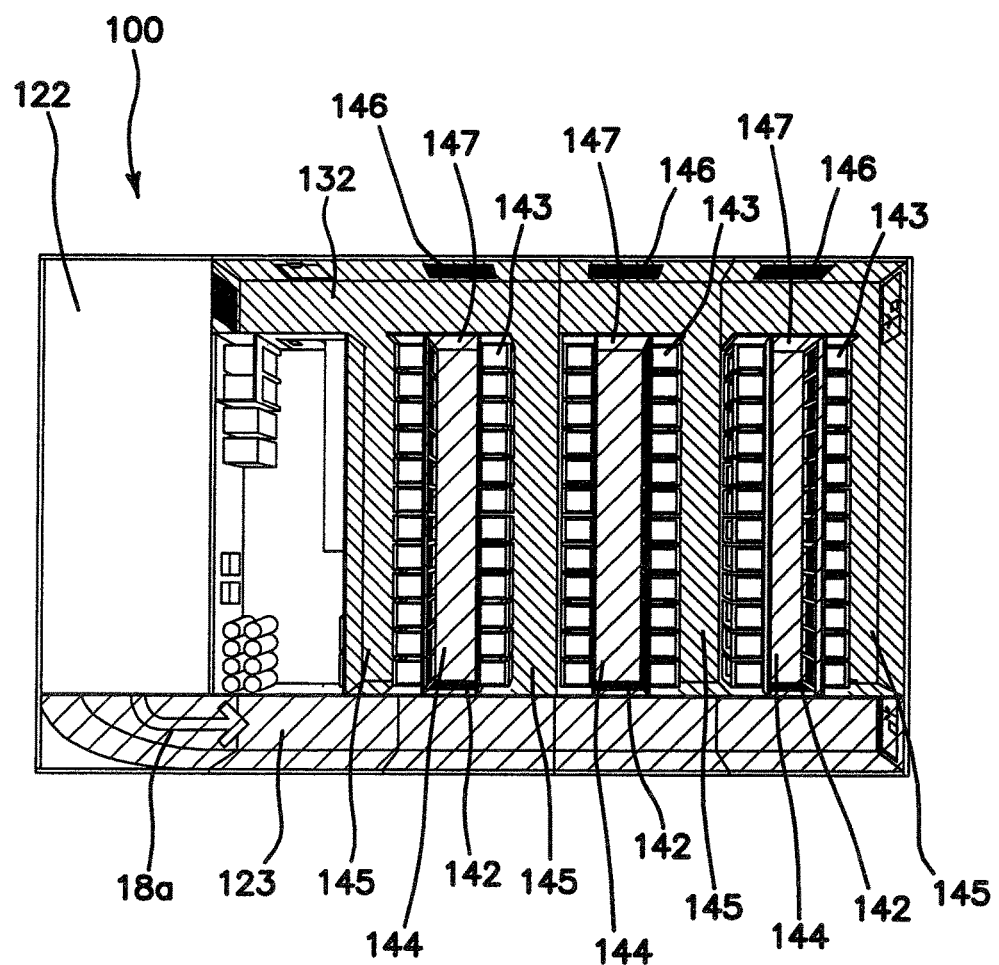
FIG. 4 is a partial plan view of a data centre building according to yet another embodiment, including schematic shading of hot and cold areas.

FIG. 4 shows a data centre building 100, similar to that shown in FIG. 3. However, the building of FIG. 4 has three rack room modules 140. Each rack room module 140 is identical. Hence, a building 100 is provided that can accommodate more racks 143.

Cooling air 18a from the air supply corridor 123 can enter the cold aisle 144 of each rack room module 140 through the controlled vents of the cooling air intake grilles 142. The hot air 16 from the racks 143 can leave the rack room modules 140 through hot aisles 145 in between the racks 143. The hot air 16 then reaches the hot air corridor 132, as before.

Figure 9:
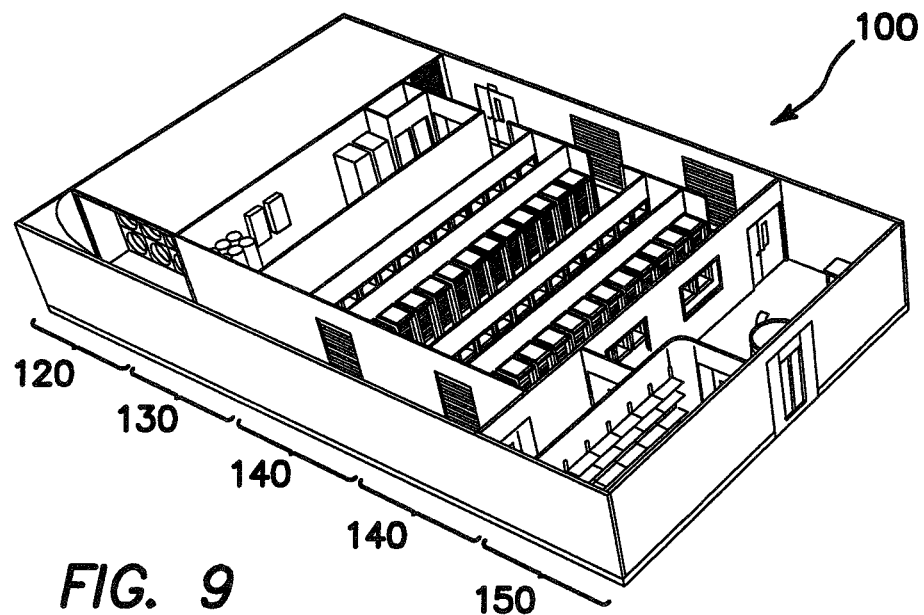
FIGS. 9-12 show how the data centre building of FIG. 3 can be enlarged by adding further rack room modules.

FIG. 9 shows a data centre building with an air optimisation module 120, a plant room module 130, an entry module 150 and two rack room modules 140.

Figure 10:
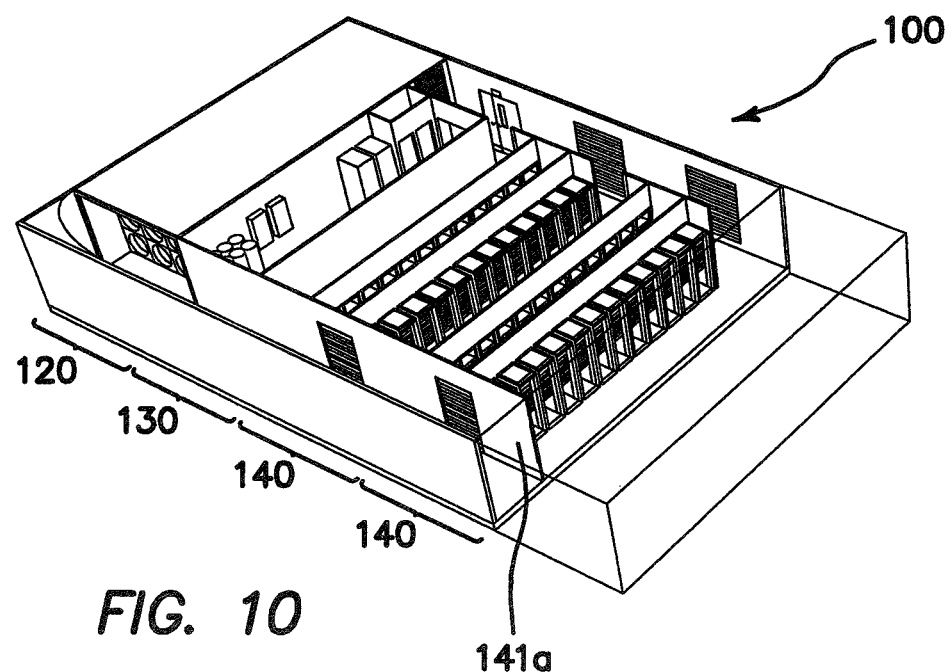

FIG. 10 shows that the entry module 150 of the building 100 of FIG. 9 can be removed to leave the front of the second rack room module 140 exposed. A blocking panel 141a is placed over then front end of the air supply corridor 123 to reduce loss of air supply pressure.

Figure 11:
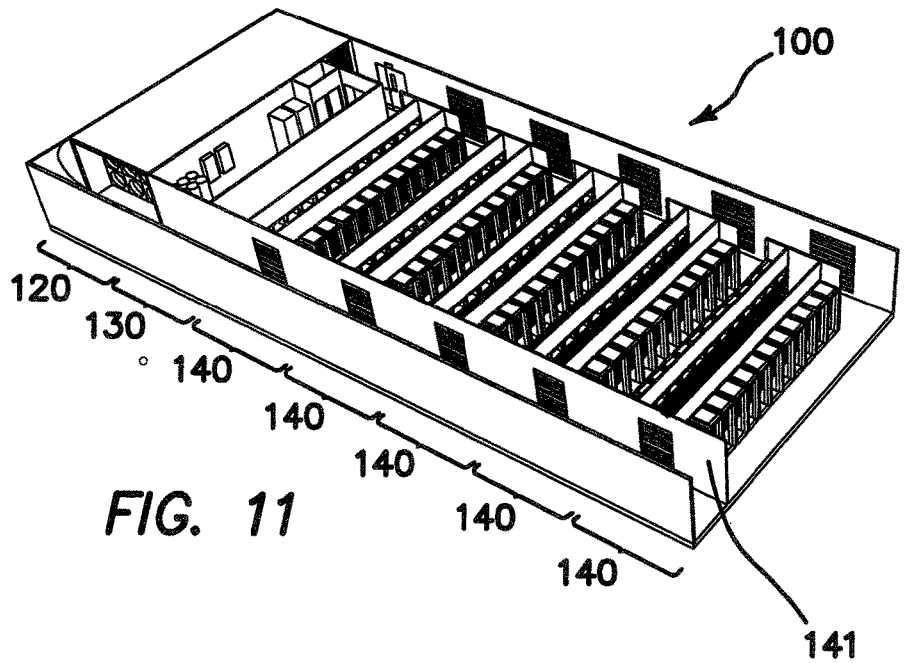

FIG. 11 shows that three (or any number) of additional rack room modules 140 can be placed next to the existing rack room modules 140 such that the internal walls 141 line up to create a lengthened air supply corridor 123. Hence, the building of FIG. 11 contains an air optimisation module 120, a plant room module 130 and five connected rack room modules 140.

Figure 12:
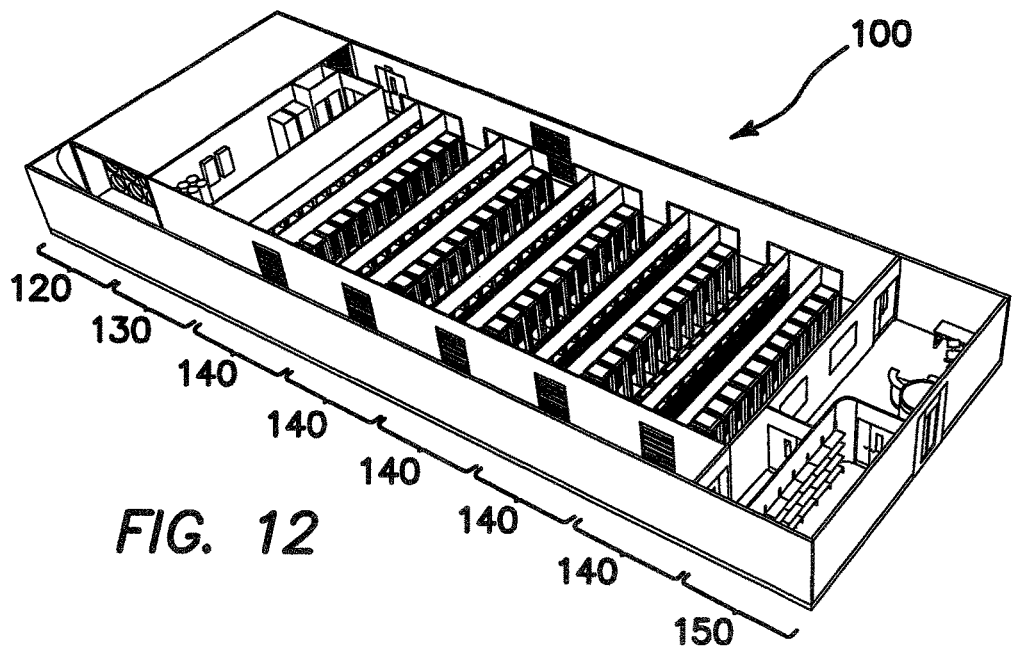

FIG. 12 shows that the entry module 150 removed from the building 100 of FIG. 9 can be replaced next to the foremost rack room module 140 of FIG. 11. Hence, the building of FIG. 9 can be expanded from having two rack room modules 140 to having five rack room modules 140.

As many rack room modules 140 as desired can be added, as long as the capacity of the air optimisation unit 122 is sufficient to cope with the cooling requirements of all the rack room modules 140.

The expansion of data centre buildings 100 can be conducted whilst the electronic components in each rack 143 of the existing rack room modules 140 are operated and cooled by cooling air 18a from the air supply corridor 123. Such a process is referred to elsewhere in this document as a "hot add" process.

Figure 13:
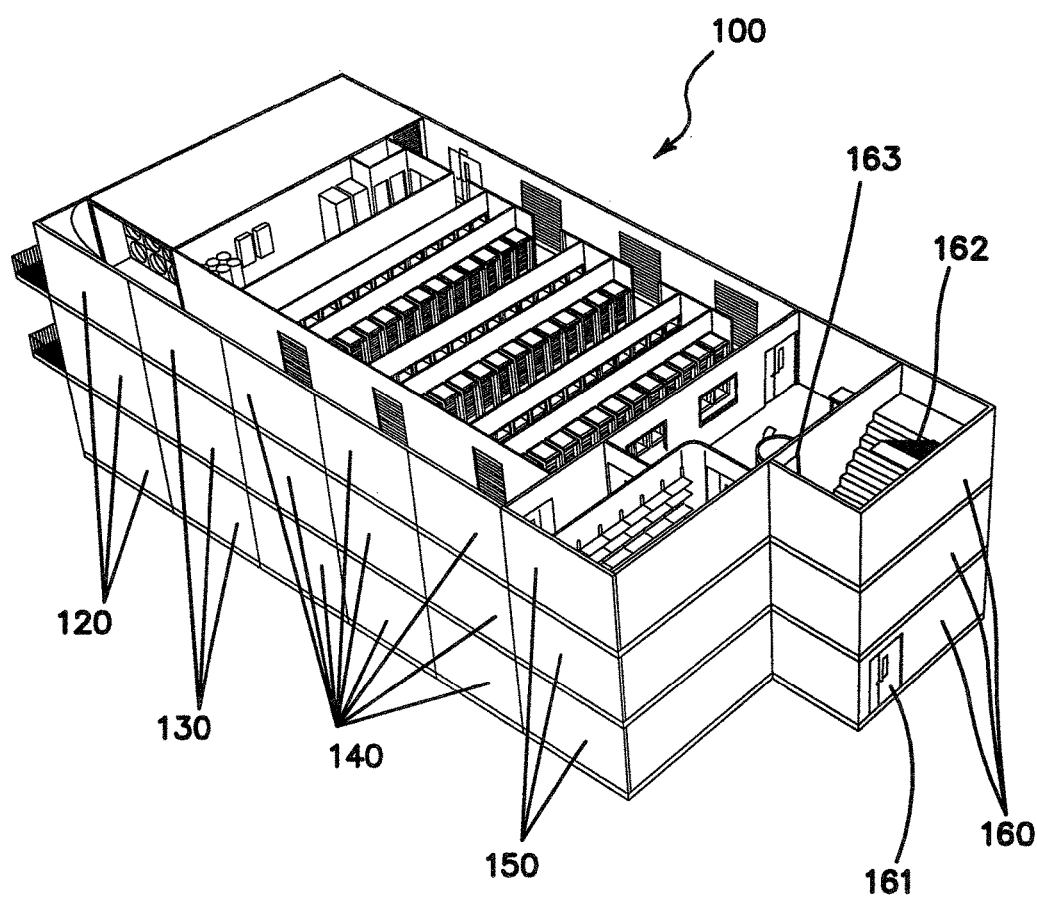
FIG. 13 shows a multi-storey data centre building.

FIG. 13 shows a multi-storey data centre building 100. The building 100 has three storeys stacked on top of each other. Each storey is made up of an air optimisation module 120, a plant room module 130, three rack room modules 140 and an entry module 150. The particular type of modular construction employed by this embodiment lends itself to a fully scalable, and very flexible, data centre construction method.

In addition, each storey includes a stair module 160 placed in front of the entry module 150, on the right hand side. Each stair module 160 is rectangular with a height identical to the entry module 150 and the rest of the modules, a width similar to the entry module 150 and a length of about half that of the entry module 150.

Each stair module 160 has an exit door 163 (visible for third storey only) on the left rear corner of the module 160 such that the exit door 163 lines up with and allows access to the entry portal 151 of the entry module 150. Hence, the exit door 163 of each stair module 160 allows access to the entry module 150 on the respective level.

Each stair module 160 also contains a set of stairs 162 extending from the bottom of the stair module 160 to the top of the stair module 160. Hence the stairs 162 allow personnel to move up to the entry module 150 above.

Of course, for the uppermost (third) storey, there is no level above and so the stairs 162 do not lead up to a next level.

The lowermost (first) storey stair module 160 also has an entry door 161 located on the left side of the front wall of the stair module 160 to allow personnel access to the building 100.

Alternatively, any or all of the above described embodiments, may not include an entry module 150. Instead, the front side of the foremost rack room module 140 is enclosed by an external front wall. The external front wall should include an air supply corridor access door on the left hand side to allow access to the air supply corridor 123 and a hot air corridor access door on the right hand side to allow access to the hot air corridor 132.

In use, the data centre building 100 of any of FIG. 3, 4, 9, 12 or 13 operates to cool the racks 143 in the rack room module(s) 140 by generating a sufficient quantity, velocity and pressure of cooling air 18a in the air optimisation unit 122. The air optimisation unit 122 also filters the air using air filters and performs humidification/de-humidification on the air, as necessary.

The cooling air 18a is pushed out of the air optimisation unit 122, directed by the curved wall 124 and moves along the air supply corridor 123. The vents in the cooling air intake grille(s) 142 are controlled so as to ensure appropriate distribution of the cooling air 18a in the cold aisle(s) 144 of the rack room module(s) 140 in dependence on the cooling requirements of the IT equipment in the racks associated with each cold aisle (which may for example be measured by temperature sensors at the rear of the racks). The cooling air 18a is drawn across the racks in the rack room module(s) 140 by the integral fans in the electrical components in the racks and cools the electrical components.

The resulting hot air 16 moves through the hot aisles 145 in the rack room module(s) 140 and plant room module 130 to the hot air corridor 132. The pressure differential between the cooling air 18a and the hot air 16 is maintained at a sufficient level to ensure there is no return of hot air 16 through the racks. This is done by monitoring the amount of air flow in the rack room module 140 using the air flow sensor. The amount of air flow is fed to the process control panel 137b in the plant room 133. The process control panel 137b then controls the fans in the air optimisation unit 122 and the various controllable vents in the building (apart from the vents 142 in the data room doors, which are used to control the amount of cooling air fed to each cold aisle) so that satisfactory air pressure is delivered to the air supply corridor 123 to give a satisfactory air pressure differential and air flow in the rack room module 140. The humidity of the air in the rack room module 140 is monitored by the humidity level sensor and fed to the process control panel 137b. The process control panel 137b then controls the humidification apparatus in the air optimisation unit 122 so that satisfactory air humidity is delivered.

The building 100 operates differently depending on the temperature of the outside ambient air. This is done in order to allow the cooling air 18a to be between 18° C. and 24° C., whilst minimising the amount of refrigerant-based mechanical cooling that needs to be performed on the air by the cooling system in the air optimisation unit 122.

Figure 14:
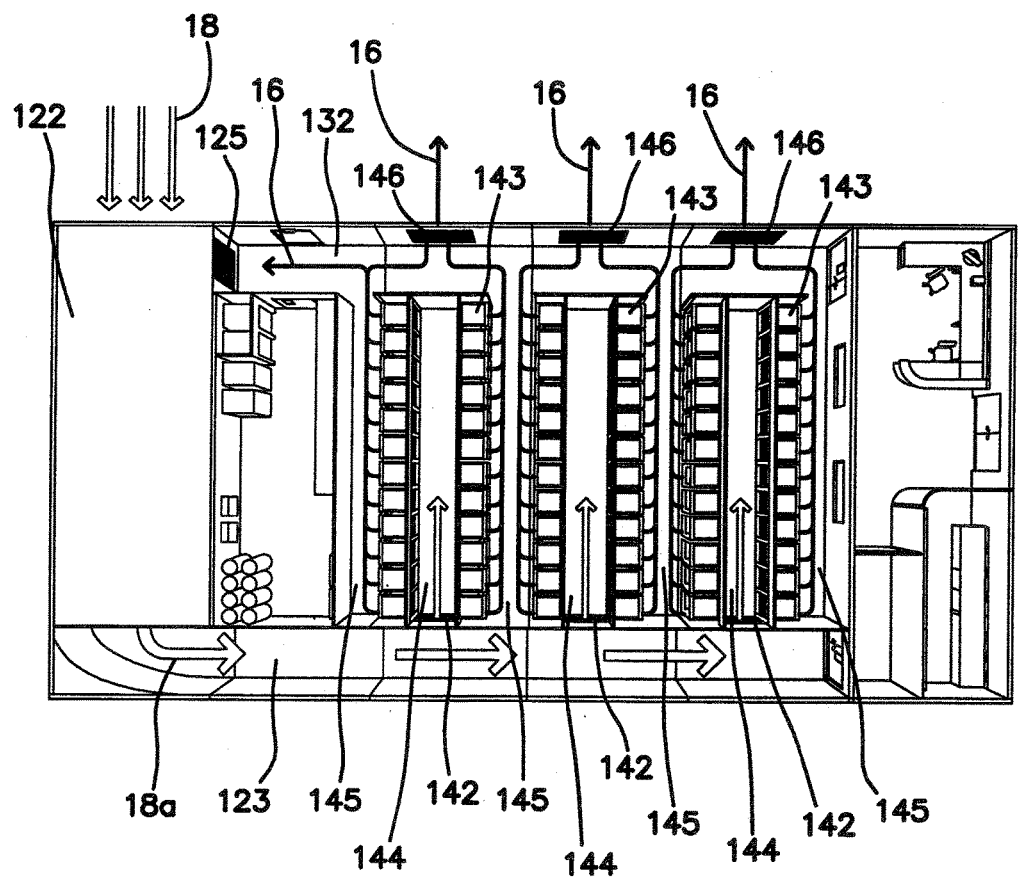
FIG. 14 is a plan view of the data centre building of FIG. 4, operating when the ambient air is at a temperature of less than 18° C.

When the outside temperature is below 18° C., as shown in FIG. 14, the process control panel 137b controls the cooling system in the air optimisation unit 122 so that the cooling system is turned off. The process control panel 137b also controls the vents in the return air grille 125 so that the vents on the grille 125 are open. This allows some of the hot air 16 in the hot air corridor 132 to re-enter the air optimisation unit 122. The rest of the hot air 16 escapes out of the building 100 through hot air outlet grille(s) 146. I.e. there is partial extraction of ambient air 18 and partial re-circulation of hot air 16. The hot air 16 that re-enters the air optimisation unit 122 goes through the air mixing box (not shown) in the unit 122 and mixes with the ambient air 18 being drawn into the air optimisation unit 122 through the ambient air intake grille 121. This results in warmer than ambient air passing from the air optimisation unit 122 into the air supply corridor 123 and reaching the cold aisle(s) 144 of the rack room module(s) 140.

The temperature of the air at the rear of each row of racks in the rack room module(s) 140 is monitored by the air temperature sensors and fed to the process control panel 137b. Pressure measurements are also taken. The process control panel 137b controls the vents 142 in the cold aisle doors in dependence on cooling demand and controls the fans in the air optimisation unit 122 and other vents so that a sufficient air flow is delivered from the air supply corridor 123 to the cold aisles in the rack room module(s) 140.

Figure 15:
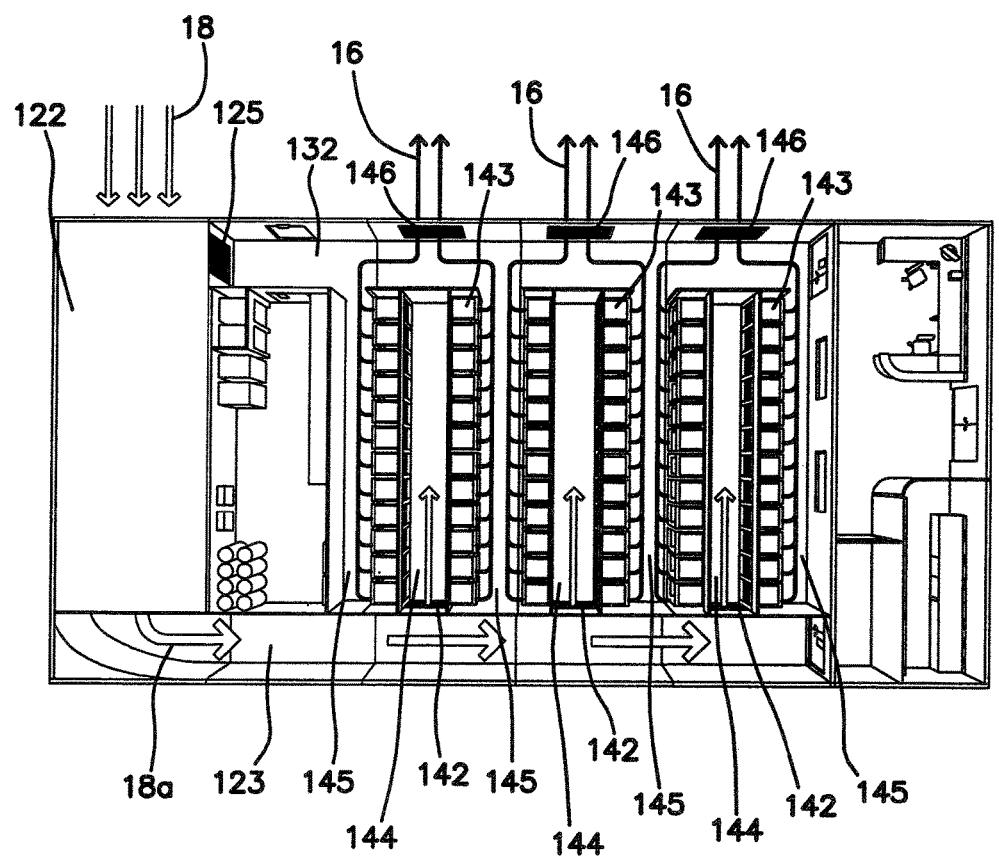
FIG. 15 is a partial plan view of the data centre building of FIG. 4, operating when the ambient air is between 18° C. and 24° C.

When the outside temperature is between 18 and 24° C., as shown in FIG. 15, the process control panel 137b controls the cooling system in the air optimisation unit 122 so that the cooling system is turned off. The process control panel 137b also controls the vents in the return air grille 125 so that the vents on the grille 125 are closed. This means that no hot air 16 can re-enter the air optimisation unit 122. I.e. there is no re-circulation of hot air 16 and there is total ambient air 18 extraction. All of the hot air 16 escapes out of the building 100 through hot air outlet grille(s) 146.

The temperature of the air at the rear of each row of racks in the rack room module(s) 140 is monitored by the air temperature sensors and fed to the process control panel 137b. Pressure measurements are also taken. The process control panel 137b controls the vents 142 in the cold aisle doors in dependence on cooling demand and controls the fans in the air optimisation unit 122 so that a sufficient air flow is delivered from the air supply corridor 123 to the cold aisles in the rack room module(s) 140 to a satisfactory temperature.

Figure 16:
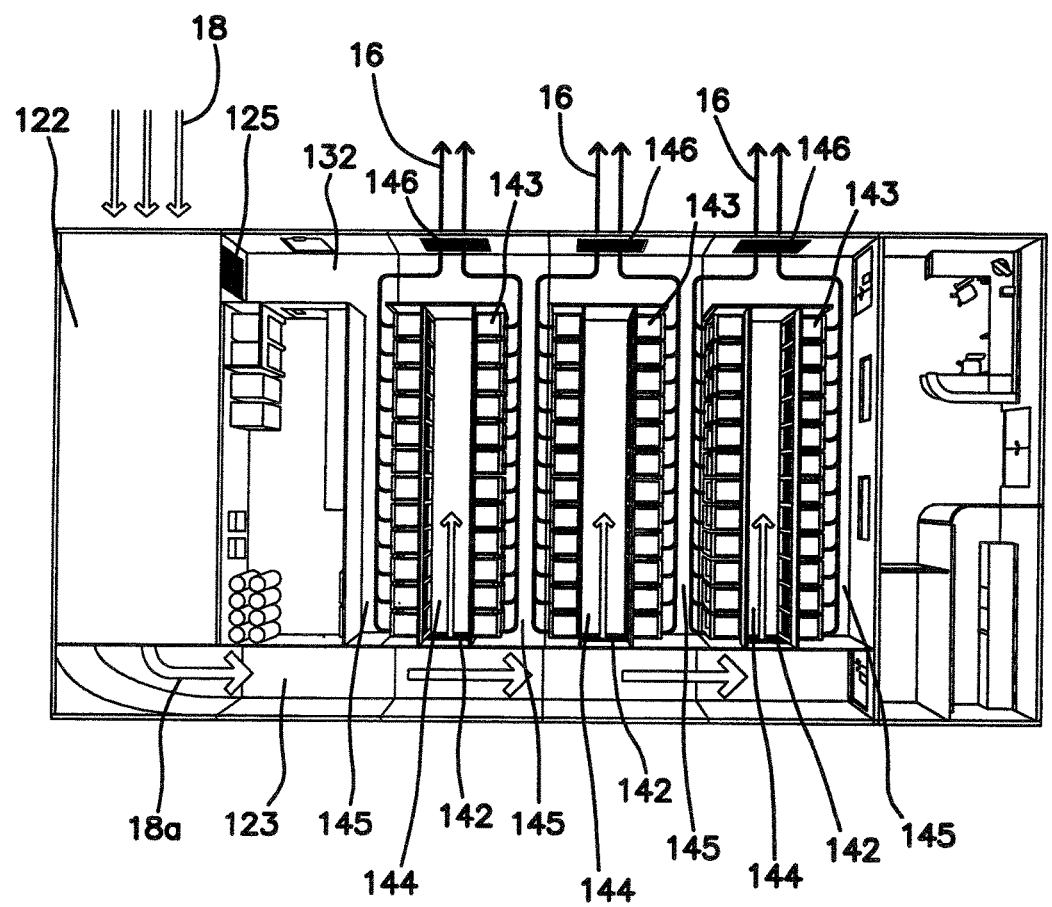
FIG. 16 is a partial plan view of the data centre building of FIG. 4, operating when the ambient air is between 24° C. and 37° C.

When the outside temperature is between 24 and 37° C., as shown in FIG. 16, the process control panel 137b controls the cooling system in the air optimisation unit 122 so that the cooling system is turned on and set to cool the cooling air 18a leaving the air optimisation unit 122 down to a maximum of 24° C. This is achieved by using the humidification unit to cause adiabatic cooling of the air. At this stage no refrigerant-based active cooling is required. The process control panel 137b also controls the vents in the return air grille 125 so that the vents on the grille 125 are closed. This means that no hot air 16 can re-enter the air optimisation unit 122. I.e. there is no re-circulation of hot air 16 and there is total ambient air 18 extraction. All of the hot air 16 escapes out of the building 100 through hot air outlet grille(s) 146.

The temperature of the air at the rear of each row of racks in the rack room module(s) 140 is monitored by the air temperature sensors and fed to the process control panel 137b. The process control panel 137b then controls the cooling air flow regime so that a sufficient air flow is delivered from the air supply corridor 123 to the cold aisles.

Figure 17:
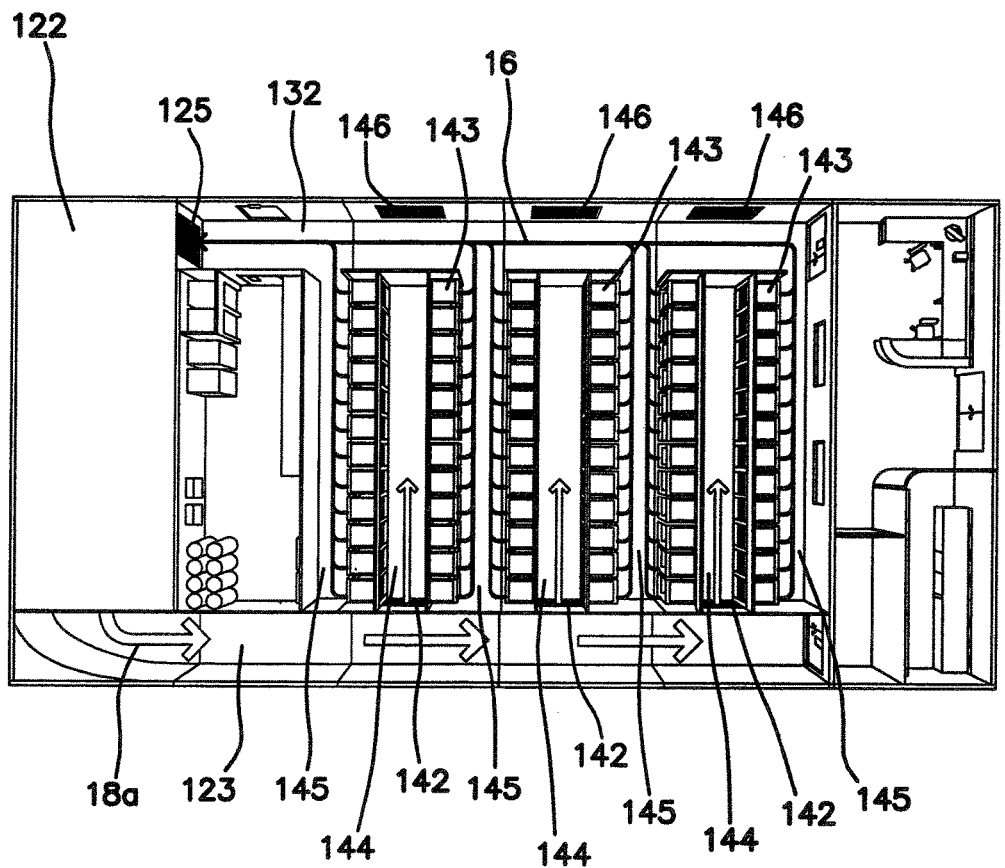
FIG. 17 is a partial plan view of the data centre building of FIG. 4, operating when the ambient air is at a temperature greater than 37° C.

When the outside temperature is above 37° C., as shown in FIG. 17, the process control panel 137b controls the cooling system in the air optimisation unit 122 so that the cooling system is turned on and set to cool the cooling air 18a leaving the air optimisation unit 122 down to a maximum of 24° C. This is achieved by means of additionally using DX-mechanical (refrigerant-based) cooling. The process control panel 137b also controls the vents in the return air grille 125 and hot air outlet grille 146 so that the vents on the grille 125 are open and the vents on hot air outlet grille(s) 146 are closed. This ensures all the hot air 16 re-enters the air optimisation unit 122. I.e. there is total re-circulation of hot air 16 and no ambient air 18 extraction. The process control panel 137b also controls the vents of ambient air intake grille 121 so they are closed. The hot air 16 goes through the air mixing box (not shown) in the air optimisation unit 122 and is re-cooled by the cooling system in the air optimisation unit 122.

The temperature of the air at the rear of the racks in the rack room module(s) 140 is monitored by the air temperature sensors and fed to the process control panel 137b. The process control panel 137b then controls the cooling air flow regime so that a sufficient air flow is delivered from the air supply corridor 123 to the cold aisles.

In the event of the VESDA (Very Early Warning Smoke Detection Apparatus) system detecting a fire, the process control panel 137b activates the fire suppression gas discharge canisters 136. Hence, gas is discharged through the air optimisation unit 122 into air supply corridor 123. At the same time, the process control panel 137b closes vents in the hot air outlet grille(s) 146 and opens vents in the return air grille 125 to ensure the air inside the building 100 is re-circulated. The VESDA system may as an initial step cause air flow into and/or out of the building to be ceased and to operate the building in an air re-circulation mode. On the one hand, if smoke is no longer detected then there may be no need to release the fire suppression gas. On the other hand, if smoke continues to be detected then it may be deduced that the cause of the smoke is within the building and not an external fire. Fire suppression is then released only as necessary.

As the fire suppression gas rapidly expands, release vents (not shown) in the building 100 are activated to maintain the building integrity.

In the event of a power cut to the external power supply of the building 100, the uninterruptible power supply 139a and back-up batteries 139b are turned on and can provide clean power to allow continuous operation of the racks 143 and other essential services for 10 minutes.

When a data centre building 100 is required, the different modules can be individually delivered on trucks, such as 40 foot articulated or flat bed trucks. The buildings are typically less than 4.2 m high and therefore are readily transported via road or rail. The modules can then be craned into place using integral lifting eyes (not shown) on the modules or using slings. The building 100 can be sited on a flat area of concrete. Alternatively, the building 100 can be placed on concrete blockwork if the site is not level or if the level of the building 100 is to match an existing building level.

The building 100 is then connected to the existing site drainage system, telecommunications supply, water supply and electrical power supply. Alternatively, a supplementary power generation unit can be added. The building 100 can also be connected to the existing building management systems, security systems or fire alarm systems of the site.

When it is required to relocate the data centre building, this can be done by disconnecting the external power supply etc. and individually craning modules onto trucks to be delivered and re-set up elsewhere.

Figure 21:
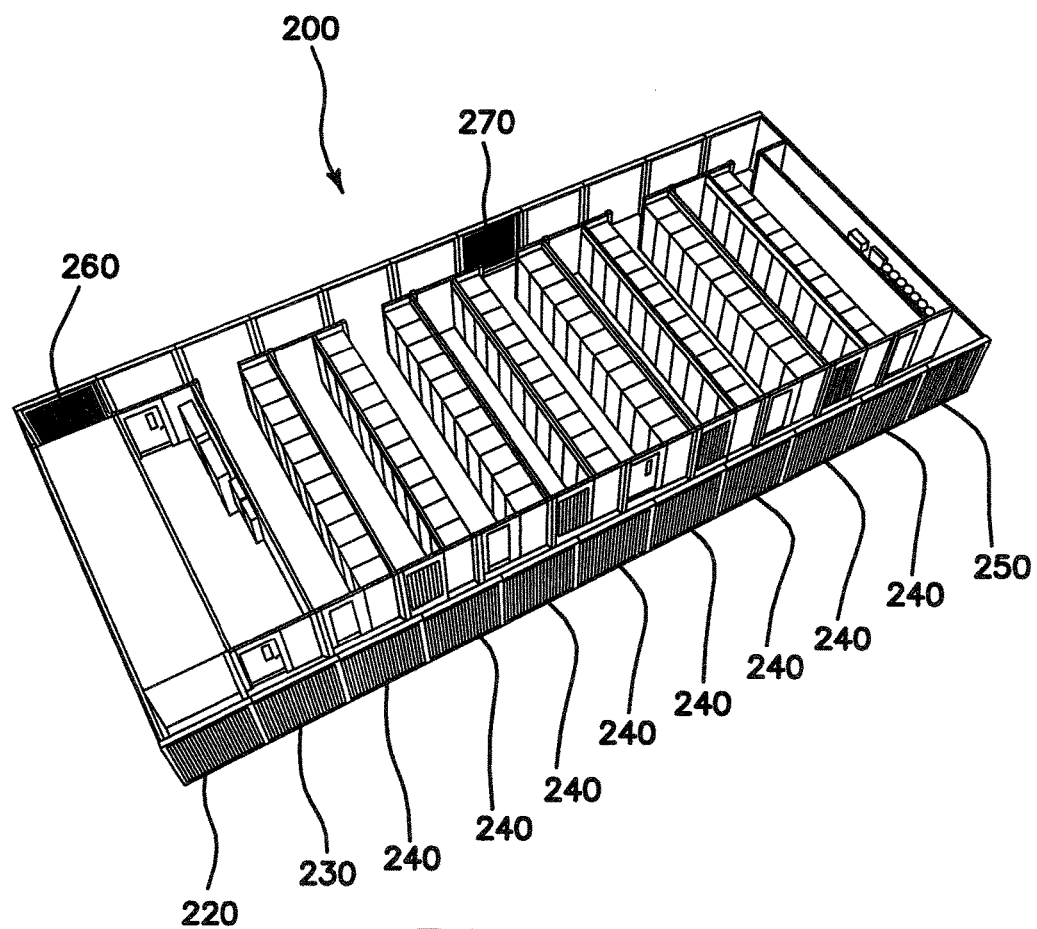
FIG. 21 shows a perspective view of a data centre building according to yet another embodiment of the invention.
Figure 22:
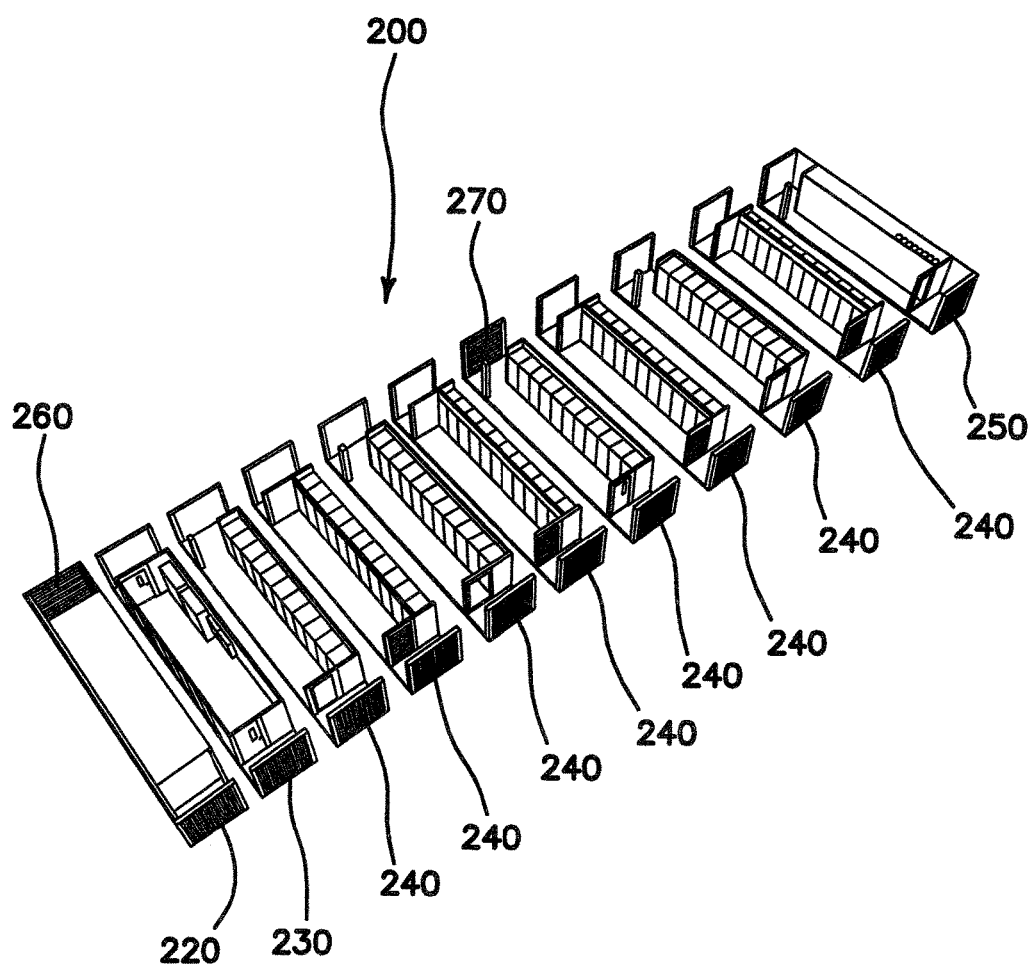
FIG. 22 shows an exploded perspective view of the data centre building of FIG. 21.

In an alternative embodiment, shown in FIGS. 21 and 22, each module has the dimensions of an ISO shipping container and is constructed so that it may be transported as a shipping container. ISO shipping containers come in a range of lengths and heights but are all 2259 mm wide between the corner fittings (measured from the centre of the hole in the fitting). Common lengths are approximately 6 m, approximately 12 m and approximately 14 m.

Each module comprises a steel framework, with the vertical parts of this framework including an integrated drainage system (not shown). The walls, roof and floor of each module are made of corrugated steel. Although in this embodiment the dimensions of the modules are different to those in the embodiments described above, the way the modules are fitted out and connected together is substantially the same. The layout of a data centre built using this type of module can therefore take any of the same forms as a data centre built using the modules shown in FIGS. 3-17.

FIG. 21 shows a data centre 200 constructed from container-sized modules. It comprises an air optimisation module 220, a plant room module 230, eight rack room modules 240, and a hot aisle unit 250. An end wall of the air optimisation module 220 and an end wall of one of the rack room modules 240 have been replaced with an air intake 260 and an exhaust air outlet 270 respectively. One or more of the panels forming an external wall of the data centre 200 may include a door (not shown). FIG. 22 is an exploded view of the data centre of FIG. 21.

Figure 23:
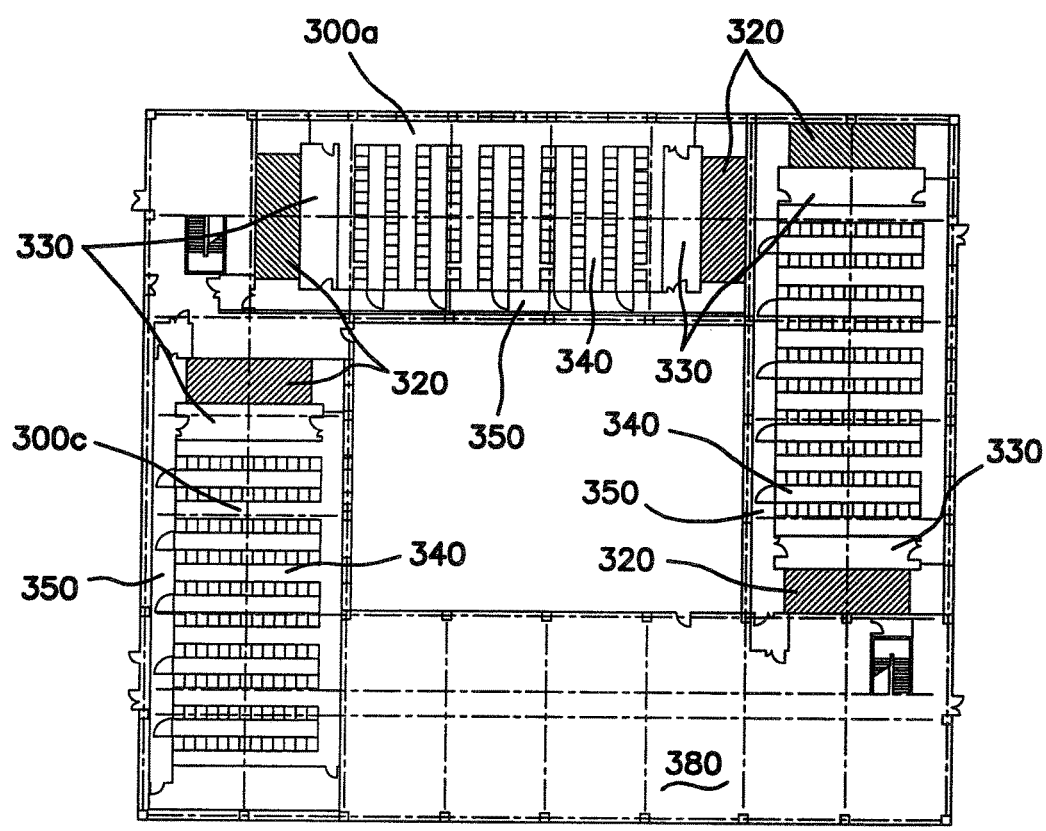
FIG. 23 shows a plan view of a floor of a building including three data centres according to a further embodiment of the invention.
Figure 24:
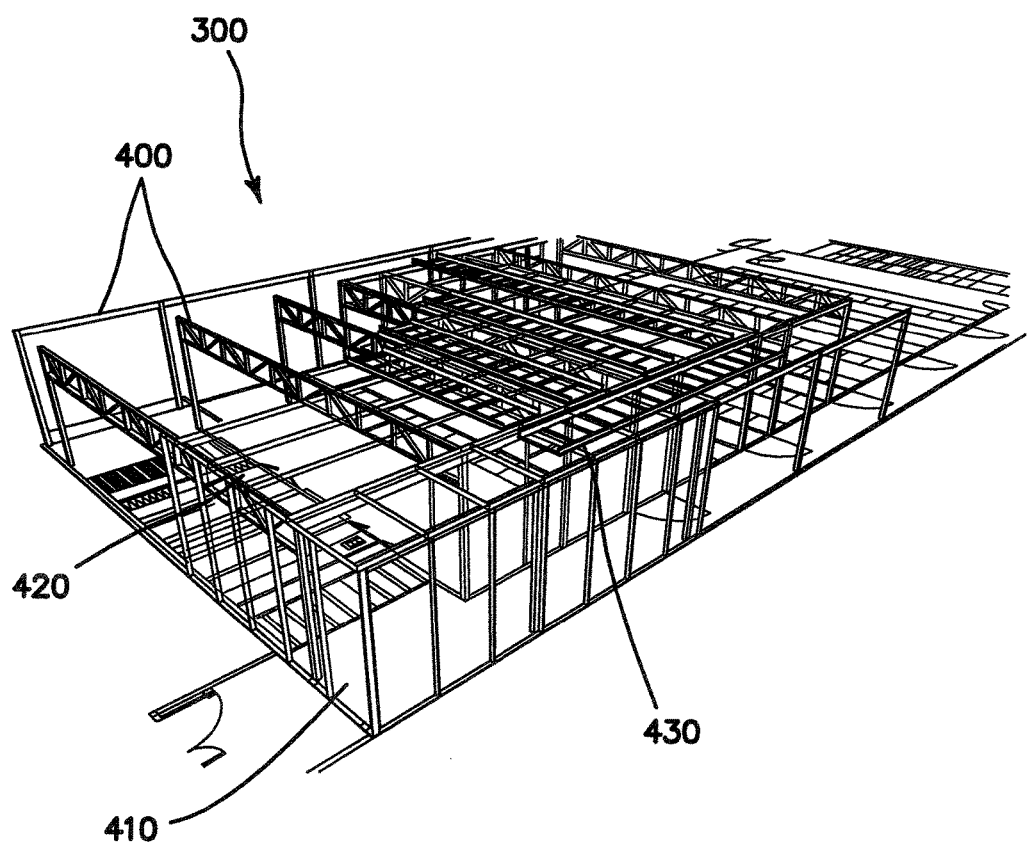
FIG. 24 shows a partial perspective view of a partially constructed data centre according to the embodiment of FIG. 23.

A further embodiment of the invention is illustrated by FIGS. 23 and 24. FIG. 23 shows the layout of a storey of a building into which three data centres 300a, 300b and 300c according to the invention have been installed. Part 380 of the storey is not taken up by a data centre and this may be used for another purpose such as office space or storage. Data centres 300a and 300b each comprise two air optimisation rooms 320, two plant rooms 330, a rack room 340 and an air supply corridor 350. Data centre 300c comprises an air optimisation room 320, a plant room 330, a rack room 340 and an air supply corridor 350. Holes (not shown) have been made in the walls of the building to serve as intakes for outside air and outlets for exhaust air.

Data centres 300a, 300b and 300c have been constructed by installing partitions into a space in the existing building. The partitions are formed using a kit of parts consisting of metal girders and insulated steel panels. FIG. 24 shows a partially constructed data centre 300 according to this embodiment of the invention. A framework 400 built from the metal girders has been constructed in a space within a building. The space has a concrete floor. Wall panels 410 and ceiling panels 420 are attached to this framework. Panels including dampers (not shown) are positioned so as to line up with the intake and outlet holes in the exterior walls of the building. Ladder racks 430 are suspended above the ceiling panels 420 to support the cabling and other mechanical and electrical services that are provided to the racks. The panels are arranged to form a data centre having an air optimisation room, a plant room, a rack room, and an air supply corridor. The layout of the data centre is the same as in other embodiments of the invention. The rack room includes separate hot aisles and cold aisles in the same arrangement as in the other embodiments of the invention.

For countries in the Northern Hemisphere, it is anticipated that the ambient air temperature will be below 37° C. 97% of the time. Hence, for these countries, the building 100 can operate in either of the first three modes of operation described for 97% of the time. Hence, for 97% of the time, the building 100 only uses ambient airflow and humidity-controlled cooling and does not need to rely on refrigerant-based cooling. This dramatically reduces the energy consumption of the data centre building 100.

Even in the hottest, driest or most humid locations on the planet, the building can still operate in the first or second mode a significant proportion of the time and therefore can use only air flow cooling. Even at temperatures of up to 37° C., the building 100 will operate in the third mode of operation and therefore can still utilise efficient means of cooling.

The most common benchmark of energy efficiency for data centres is power usage efficiency (PUE). In this embodiment, this may conveniently be defined as the total energy used by the data centre divided by the energy deployed to the racks 143. Typical prior art data centres have a PUE of greater than 1.5. A data centre building 100 of the present invention could have a PUE of less than 1.2 for most parts of the world. This figure would increase for hotter parts of the world where refrigerant-based mechanical cooling has to be used more often.

Figure 19A:
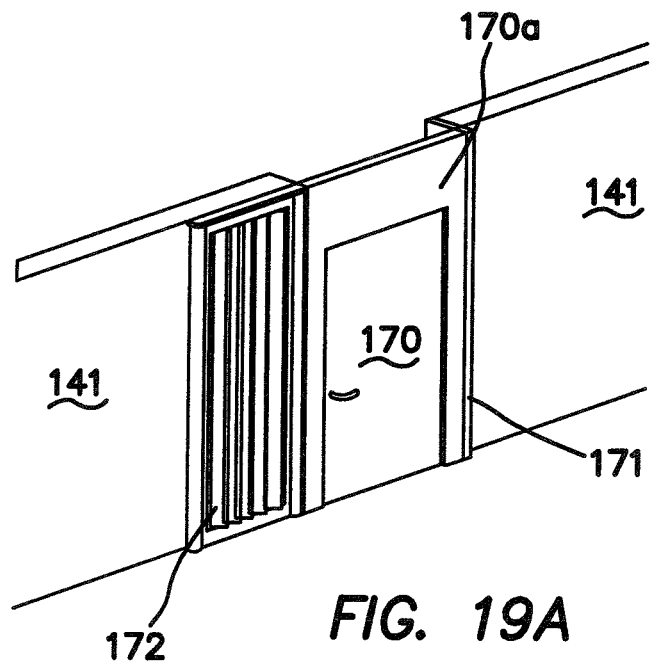
FIGS. 19a to 19d show a rack room door with variable air flow intake according to a yet further embodiment of the invention.
Figure 19B:
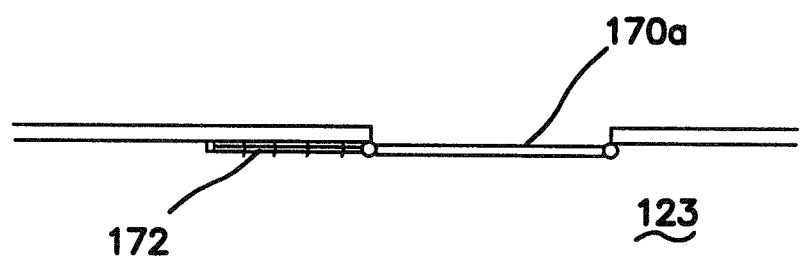
Figure 19C:
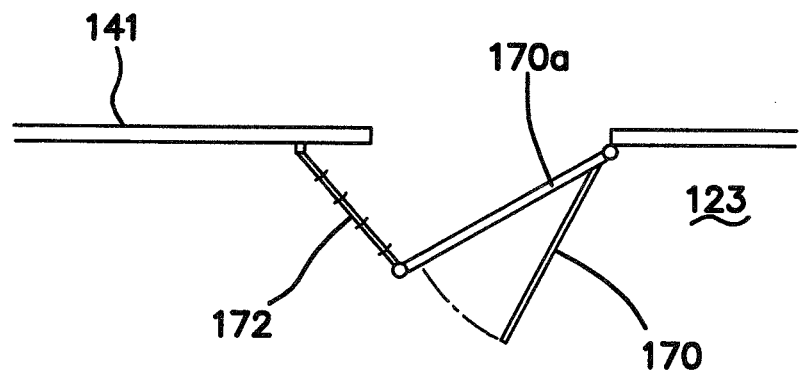
Figure 19D:
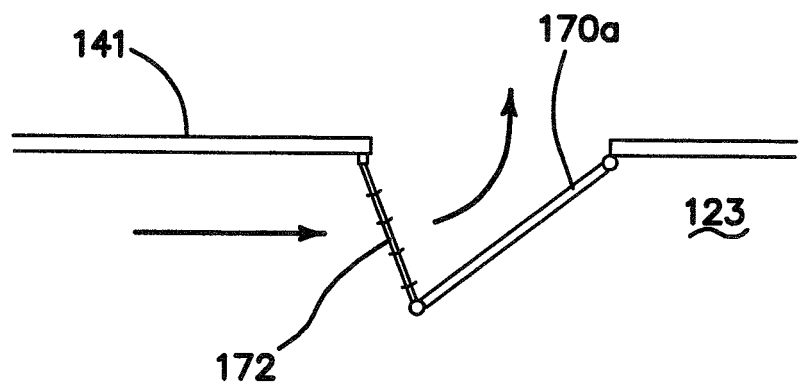

In the above-described embodiments, the securable door allowing personnel access from the air supply corridor 123 to the cold aisle 144 of the rack room module 140 includes an adjustable air intake means in the form of an air intake grille 142 including vents. The door can be configured differently to provide cooling air 18*a* into the cold aisle 144 via the doorway. FIGS. 19*a, b, c* and *d* show such a door 170. The door is mounted in a door frame 170*a*. The door frame is hinged to the internal wall 141 of the room module 140, adjacent a door hole in the internal wall, along a first side 171 of the door frame. The first side 171 of the door frame is the side furthest from the air optimisation unit 122. The door frame 170*a* is hinged to a first side of an air intake grille 172 along a second opposite side of the door frame. The grille is attached to the internal wall 141 by a hinge along a second opposite side of the grille. The hinge is also slidable along the internal wall 141. When the door frame 170*a* is in a closed position, as shown in FIGS. 19*a* and 19*b*, the door frame and grille 172 lie in line with each other and parallel to the internal wall 141, such that the door and door frame covers the hole in the internal wall 141 and the grille lies flush behind the wall 141. The door 170 can be opened from the door frame 170*a* when the frame is in the closed position. When the door frame is in an open position, as shown in FIG. 19*d*, the door frame is hinged away from the hole in the wall 141. The grille pivots with respect to the door frame and by the hinge on the internal wall 141 and the internal wall hinge slides along the internal wall 141 such that the second side of the grille remains in contact with the internal wall 141 and the first side of the grille remains connected to the second side of the door frame. Hence, an angled path against the door and door frame and through the grille is provided for air in the air supply corridor 123. The door arrangement therefore acts as a variable air inlet scoop. The air thus flows from bottom to top as shown in FIGS. 19*c* and *d* (the air supply corridor being below the doorway in the Figures). The door can also be opened from the door frame in the open position, as shown in FIG. 19*c*. The door frame and grille can also be positioned in a number of intermediate positions between the fully open and fully closed positions described above. The door arrangement could of course also be used in a reverse configuration, so that first side of the door frame is the side nearest the air optimisation unit with air flowing from the top to bottom as shown in FIGS. 19*c* and *d* (the air supply corridor being below the doorway in the Figures).

Figure 20:
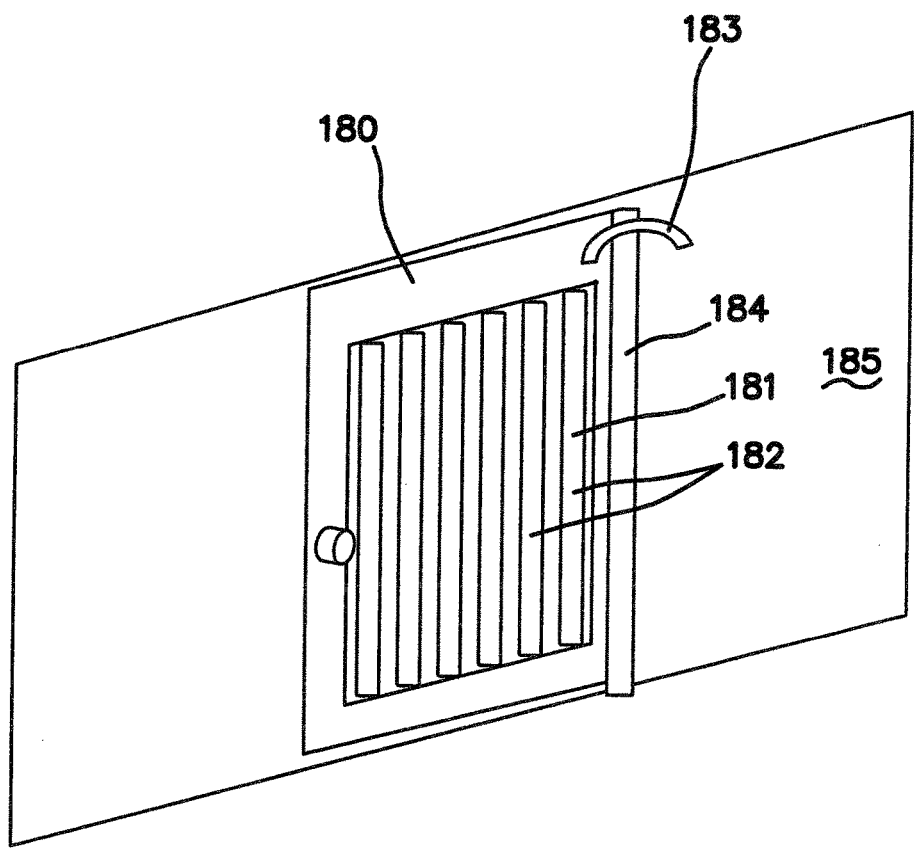
FIG. 20 shows a rack room door with variable air flow intake according to another embodiment of the invention.

FIG. 20 shows yet another embodiment of a door 180 for allowing personnel access therethrough whilst also providing a means for controlling airflow through the door whilst the door is in its closed position. The door thus includes adjustable air intake means in the form of a vent 181 having a number of vertical blades 182 arranged in a row. The blades are each mounted for rotation about a vertical axis, such that the vent may be moved between closed and open positions by means of rotation of the blades. The blades 182 are arranged such that pairs of adjacent blades are arranged to rotate simultaneously in opposite directions. Having such an arrangement facilitates better control of the air-flow in comparison to the case where all blades rotate in the same direction. Two motors (not shown) are arranged to move the blades 182, one motor for the odd-numbered blades and one motor for the even-numbered blades (counting from left to right). (It will be appreciated that one motor could be arranged to control all the blades.) The area covered by the blades extends across about 80% of the width of the door. The area covered by the blades 182 extends across about 60% of the height of the door. The effective open area when the vent 181 is fully open is about 1.4 m$^2$. The vent is arranged such that in the event of a failure the vent fails "open".

The door arrangement includes a flexible cable 183 that runs from the motors to the hinge 184 side of the door and then onto the structure of the adjacent wall 185. The cable carries a control signal which controls the operation of the motors. The control signal is preferably set in dependence on measured characteristics of the air in or immediately outside the building.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

The air supply corridor 123 from the air optimisation unit 122 to the rack room module(s) 140 may be independent of the passageway leading to the rack room module(s) 140. The air may be supplied at least partially via an under-floor duct.

The data centre building 100 need not be constructed from separate modules.

Moreover, cooling air may be transported through a wall of the rack room via one or more apertures or passageways in the wall that are not arranged to permit personnel access. There may be an access door to the rack room that is not part of the intended path for cooling air.

The racks and aisles defined by the racks need not be straight and/or rectangular in plan-view.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A data centre building comprising:
   a floor;
   racks of items of electronic equipment accommodated in a plurality of rack storage areas, the data centre building being arranged to cool the items of electronic equipment when the data centre is in use;

a plurality of cold aisles interleaved between a multiplicity of hot aisles, adjacent hot and cold aisles being separated by at least one rack storage area;

an access corridor, wherein the access corridor together with the cold aisles provides personnel access to the plurality of rack storage areas;

a humidity-based cooling unit;

one or more controllable air circulation devices, comprising one or more fans, upstream of the racks of items of electronic equipment arranged to transport air to the cold aisles and thus to the racks of items of electronic equipment, via the humidity-based cooling unit, the air comprising one of (a) ambient air from outside the data centre building and (b) ambient air from outside the data centre building and recirculated air, the air being transported above the floor via the access corridor to the plurality of cold aisles; and an exhaust for exhausting air removed from the racks of items of electronic equipment from the data centre building;

wherein the air circulation devices, humidity-based cooling unit and access corridor are sized and structured to transport sufficiently large volumes of air per second above the floor to the racks of items of electronic equipment and to remove from the racks of items of electronic equipment at a rate high enough to cool the items of electronic equipment when the data centre is in use.

2. A data centre building according to claim 1, wherein the one or more controllable air circulation devices are arranged to cause circulation of the air to the rack storage areas under a controlled pressure regime, the pressure regime comprising maintaining differential pressures as between the pressure in a cold aisle and the pressure in a hot aisle, whereby air flow is encouraged from the cold aisle to the hot aisle.

3. A data centre building according to claim 1, wherein each rack of items of electronic equipment comprises a multiplicity of slots for housing the items of electronic equipment and the exhaust is sized to permit exhaust rates of at least 0.00024 $m^3 s^{-1}$ per slot.

4. A data centre building according to claim 1, wherein the exhaust comprises one or more controllable vents.

5. A data centre building according to claim 1, comprising one or more over-rack blanking plates positioned between the top of each rack and a ceiling, the one or more blanking plates thereby assisting in entraining air-flow through said racks.

6. A data centre building according to claim 1, comprising at least one blanking panel extending between and connecting at least one end of alternating pairs of said plurality of rows of racks, the blanking panels thereby assisting in entraining air-flow through said racks.

7. A data centre according to claim 1, wherein at least one cold aisle, at least one hot aisle, or at least one hot aisle and at least one cold aisle comprises a doorway to the aisle and an access door providing personnel access to the aisle.

8. A data centre comprising:
a) a floor;
b) items of electronic equipment accommodated in racks arranged in a plurality of rows of racks on the floor;
c) a plurality of aisles, comprising a plurality of cold aisles interleaved between a multiplicity of hot aisles, wherein each aisle is separated from at least one other aisle by at least one of the said plurality of rows of racks;
d) one or more controllable air circulation devices, comprising one or more fans, located upstream of said plurality of aisles;
e) one or more over-rack blanking plates positioned between the top of each rack and a ceiling;
f at least one blanking panel extending between and connecting at least one end of alternating pairs of said plurality of rows of racks;
e) an access corridor, wherein the access corridor and the cold aisles provide personnel access to the plurality of rows of racks; and
f) a humidity-based cooling unit;
said one or more blanking plates and said blanking panels thereby assisting in entraining air-flow through said racks, said data centre being structured and configured to transport air, comprising ambient air from outside the data centre building and optionally recirculated air, to the cold aisles and thus to the rows of racks, via the humidity-based cooling unit, the air being transported above the floor via the access corridor to the plurality of cold aisles; and
an exhaust for exhausting air removed from the rows of racks from the data centre building.

9. A data centre according to claim 8, wherein at least one cold aisle, at least one hot aisle, or at least one hot aisle and at least one cold aisle comprises a doorway to the aisle and an access door providing personnel access to the aisle.

10. A data centre comprising:
a plurality of racks of items of electronic equipment requiring cooling in a plurality of rack storage areas, so arranged to form a plurality of cold aisles interleaved between a multiplicity of hot aisles, adjacent hot and cold aisles being separated by at least one rack storage area,
a floor defining a floor-level beneath the plurality of racks of items of electronic equipment,
at least one access corridor which together with the cold aisles provides access to the plurality of rack storage areas,
an air optimiser system comprising one or more controllable air circulation devices comprising one or more fans and a humidity-based cooling unit, the air optimiser system being positioned upstream of the racks of items of electronic equipment,
an air flow path extending from the air optimiser system to the racks of items of electronic equipment, the air flow path being located entirely above floor-level and having a cross-sectional area greater $2m^2$ for at least 90% of the length of the air flow path, and
an exhaust for exhausting air removed from the rows of racks from the data centre building, the one or more controllable air circulation devices being arranged to transport air along the air flow path to the items of electronic equipment, the air comprising one of (a) ambient air from outside the data centre building and (b) ambient air from outside the data centre building and recirculated air, and the humidity-based cooling unit being arranged to cool the air, the data centre being structured and configured to transport air along the air flow path to the items of electronic equipment, and to remove air from the racks of items of electronic equipment, at a rate high enough to cool the items of electronic equipment.

11. A data centre according to claim 10, wherein the air flow path includes at least part of the at least one access corridor.

12. A data centre building comprising:
racks of items of electronic equipment arranged in rows on a floor;
at least one air supply path comprising an air supply corridor and a cold aisle, said cold aisle being disposed between two rows of racks of electronic equipment, and the air supply corridor and the cold aisle providing personnel access to the two rows of racks of items of electronic equipment;
an air optimiser system comprising an adiabatic evaporative cooler arranged to provide conditioned air by adiabatically cooling air comprising one of (a) ambient air from outside the data centre building and (b) ambient air from outside the data centre building and recirculated air, the air optimiser system being arranged to control transport of conditioned air above the floor along via the at least one air supply path to the racks of items of electronic equipment; and
at least one air removal path comprising a hot aisle separated from the cold aisle of the air supply path by one of the rows of racks of items of electronic equipment, said row of racks of items of electronic equipment being arranged to allow the conditioned air to flow from the cold aisle of the at least one air supply path to the hot aisle of the at least one air removal path thus absorbing heat from the items of electronic equipment and providing heated conditioned air, the at least one air removal path comprising at least one exhaust arranged to exhaust at least some of the heated conditioned air from the data centre building.

13. A data centre building according to claim 12, wherein for at least 90% of the distance along the air supply path, the air supply path has a cross-sectional area greater $2m^2$.

14. A data centre building according to claim 12, comprising:

i) one or more over-rack blanking plates positioned between the tops of the rows of racks and a ceiling, and ii) at least one blanking panel extending between and connecting at least one end of alternating pairs of said rows of racks, the blanking plates and the blanking panels thereby assisting in entraining air-flow through said racks.

15. A data centre building according to claim 12, wherein at least one cold aisle, at least one hot aisle, or at least one hot aisle and at least one cold aisle comprises a doorway to the aisle and an access door providing personnel access to the aisle.

16. A data centre building according to claim 12, wherein the air optimiser system is configured to transport conditioned air to a plurality of cold aisles.

17. A data centre building according to claim 12, wherein the air optimiser system comprises one or more of:
   i) a plurality of fans;
   ii) a plurality of filters; or
   iii) a mechanical cooling system.

18. A data centre building according to claim 12, wherein the air optimiser system comprises at least one mixing chamber, the mixing chamber being arranged for mixing aid ambient air and said optional recirculated air.

19. A data centre building according to claim 12, wherein the air optimiser system comprises an ambient air intake grille for admitting ambient air into the air optimiser system and a recirculated air intake grille for admitting recirculated air into the air optimiser system, wherein the ambient air intake grille and the recirculated air intake grille each comprise at least one controllable vent for controlling the amounts of ambient air and recirculated air admitted into the air optimiser system.

* * * * *